(12) United States Patent
Chuang

(10) Patent No.: US 11,456,737 B2
(45) Date of Patent: Sep. 27, 2022

(54) SELF-DRIVEN GATE-DRIVING CIRCUIT

(71) Applicant: Delta Electronics, Inc., Taoyuan (TW)

(72) Inventor: Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/155,914

(22) Filed: Jan. 22, 2021

(65) Prior Publication Data

US 2021/0226623 A1 Jul. 22, 2021

Related U.S. Application Data

(60) Provisional application No. 62/964,381, filed on Jan. 22, 2020.

(51) Int. Cl.
| | |
|---|---|
| *H03K 3/00* | (2006.01) |
| *H03K 17/06* | (2006.01) |
| *H03K 17/10* | (2006.01) |
| *H03K 19/0185* | (2006.01) |
| *H03K 17/16* | (2006.01) |
| *H03K 3/012* | (2006.01) |
| *H02H 1/00* | (2006.01) |
| *H02H 9/02* | (2006.01) |
| *H02M 1/08* | (2006.01) |
| *H02M 1/32* | (2007.01) |
| *H03K 17/687* | (2006.01) |

(52) U.S. Cl.
CPC ......... *H03K 17/165* (2013.01); *H02H 1/0007* (2013.01); *H02H 9/02* (2013.01); *H02M 1/08* (2013.01); *H02M 1/32* (2013.01); *H03K 3/012* (2013.01); *H03K 17/687* (2013.01); *H03K 2217/0036* (2013.01)

(58) Field of Classification Search
None
See application file for complete search history.

(56) References Cited

U.S. PATENT DOCUMENTS

| 5,559,452 A * | 9/1996 | Saito | H03K 17/063 |
| | | | 326/27 |
| 6,366,124 B1 * | 4/2002 | Kwong | H03K 17/063 |
| | | | 326/81 |
| 8,406,634 B2 * | 3/2013 | Xu | H03F 1/342 |
| | | | 398/155 |

\* cited by examiner

*Primary Examiner* — Kenneth B Wells
(74) *Attorney, Agent, or Firm* — Muncy, Geissler, Olds & Lowe, P.C.

(57) ABSTRACT

A gate-driving circuit for turning on and off a switch device including a gate terminal coupled to a driving node, a drain terminal coupled to a power node, and a source terminal is provided. The gate-driving circuit includes a driving switch and a voltage control circuit. The driving switch includes a gate terminal coupled to a control node, a drain terminal coupled to the power node, and a source terminal coupled to the driving node. The voltage control circuit is coupled between the control node and the driving node. When a positive pulse is generated at the control node, the voltage control circuit provides the positive pulse to the driving node with a time delay.

22 Claims, 16 Drawing Sheets

US 11,456,737 B2

SELF-DRIVEN GATE-DRIVING CIRCUIT

CROSS REFERENCE TO RELATED APPLICATIONS

This application claims the benefit of U.S. Provisional Application No. 62/964,381, filed on Jan. 22, 2020, the entirety of which is incorporated by reference herein.

BACKGROUND OF THE INVENTION

Field of the Invention

The disclosure relates generally to a gate-driving circuit driving a switch device, and more particularly it relates to a self-driven gate-driving circuit driving a switch device.

Description of the Related Art in a power circuit, a charge pump is always required to boost the supply voltage to a higher voltage for driving the switch device. FIG. 1 illustrates a conventional power circuit. As shown in FIG. 1, the high-side driver DRV1 is configured to drive the first switch device 110A, and the low-side driver DRV2 is configured to drive the second switch device 110B. In addition, the boost capacitor CB and the boost diode DB are configured to boost the supply voltage VDD to the boost voltage VB, such that the first switch device 110A can be fully turned on. Therefore, the first switch device 110A supplied by the input voltage VIN and the second switch device 110B can drive the load device RL through the inductor L and the capacitor C.

BRIEF SUMMARY OF THE INVENTION

Self-driven gate-driving circuits are provided herein. The proposed self-driven gate-driving circuits do not require a supply voltage for powering nor a plurality of transistors, which leads to greatly power consumption reduction and cost reduction.

In an embodiment, a gate-driving circuit for turning on and off a switch device comprising a gate terminal coupled to a driving node, a drain terminal coupled to a power node, and a source terminal is provided. The gate-driving circuit comprises a driving switch and a voltage control circuit. The driving switch comprises a gate terminal coupled to a control node, a drain terminal coupled to the power node, and a source terminal coupled to the driving node. The voltage control circuit is coupled between the control node and the driving node. When a positive pulse is generated at the control node, the voltage control circuit provides the positive pulse to the driving node with a time delay.

According to an embodiment of the invention, when the positive pulse is generated at the control node, a voltage of the control node rises from a low voltage level to a supply voltage so that the driving switch is turned on to provide a power voltage of the power node to the driving node so as to turn on the switch device.

According to an embodiment of the invention, when the voltage of the control node reaches the supply voltage, a driving voltage of the driving node is still in a low voltage level so that the driving switch is turned on due to a voltage difference from the control node to the driving node so as to turn on the switch device.

According to an embodiment of the invention, the switch device is a silicon device.

According to another embodiment of the invention, the switch device is a SiC device.

According to another embodiment of the invention, the switch device is a GaN device.

According to an embodiment of the invention, the driving switch is a silicon device.

According to another embodiment of the invention, the driving switch is a SiC device.

According to another embodiment of the invention, the driving switch is a GaN device.

According to an embodiment of the invention, the voltage control circuit comprises a first resistor. The first resistor is coupled between the control node and the driving node.

According to another embodiment of the invention, the voltage control circuit comprises a transistor. The transistor comprises a control terminal coupled to the control node, a first terminal coupled to the control node, and a second terminal coupled to the driving node.

According to another embodiment of the invention, the voltage control circuit comprises a first diode. The first diode comprises an anode coupled to the control node and a cathode coupled to the driving node.

According to another embodiment of the invention, the voltage control circuit comprises a second zener. The second zener comprises an anode coupled to the control node and a cathode coupled to the driving node.

According to another embodiment of the invention, the voltage control circuit comprises a third zener. The third zener comprises an anode coupled to the driving node and a cathode coupled to the control node.

According to another embodiment of the invention, the voltage control circuit comprises a fourth zener and a fifth zener. The fourth zener comprises an anode and a cathode coupled to the control node. The fifth zener comprises an anode coupled to the anode of the fourth zener and a cathode coupled to the driving node.

According to another embodiment of the invention, the voltage control circuit comprises a sixth diode and a seventh diode. The sixth diode comprises an anode coupled to the control node and a cathode coupled to the driving node. The seventh diode comprises an anode coupled to the driving node and a cathode coupled to the control node.

According to another embodiment of the invention, the voltage control circuit comprises an eighth zener and a ninth zener. The eighth zener comprises an anode coupled to the control node and a cathode coupled to the driving node. The ninth zener comprises an anode coupled to the driving node and a cathode coupled to the control node.

According to another embodiment of the invention, the voltage control circuit comprises a current-control resistor, a first transistor, a second transistor, a third transistor, and a reverse diode. The current-control resistor is coupled to the control node. The first transistor comprises a control terminal coupled to the current-control resistor, a first terminal coupled to the current-control resistor, and a second terminal. The second transistor comprises a control terminal coupled to the second terminal of the first transistor, a first terminal coupled to the second terminal of the first transistor, and a second terminal. The third transistor comprises a control terminal coupled to the second terminal of the second transistor, a first terminal coupled to the second terminal of the second transistor, and a second terminal coupled to the driving node. The reverse diode comprises a reverse anode coupled to the driving node and a reverse cathode coupled to the control node.

According to another embodiment of the invention, the voltage control circuit comprises a tenth diode and an eleventh zener. The tenth diode comprises an anode coupled to the control node and a cathode. The eleventh zener comprises an anode coupled to the driving node and a cathode coupled to the cathode of the tenth diode.

According to another embodiment of the invention, the voltage control circuit comprises a twelfth diode and a thirteenth zener. The twelfth diode comprises an anode coupled to the control node and a cathode. The thirteenth zener comprises an anode coupled to the cathode of the twelfth diode and a cathode coupled to the driving node.

According to another embodiment of the invention, the voltage control circuit comprises a second resistor and a first bidirectional-conducting device. The second resistor is coupled to the driving node. The first bidirectional-conducting device is coupled between the second resistor and the control node.

According to another embodiment of the invention, the voltage control circuit comprises a third resistor and a second bidirectional-conducting device. The third resistor is coupled between the control node and the driving node. The second bidirectional-conducting device is coupled between the control node and the driving node.

According to another embodiment of the invention, the voltage control circuit comprises a third bidirectional-conducting device, a fourth resistor, and a fourth bidirectional-conducting device. The third bidirectional-conducting device is coupled to the control node. The fourth resistor is coupled between the third bidirectional-conducting device and the driving node. The fourth bidirectional-conducting device is coupled between the third bidirectional-conducting device and the driving node.

According to another embodiment of the invention, the gate-driving circuit further comprises a second voltage control circuit. The second voltage control circuit is coupled between the driving node and the source terminal of the switch device and configured to clamp a voltage from the gate terminal to the source terminal of the switch device.

According to an embodiment of the invention, the second voltage control circuit comprises a fourth transistor. The fourth transistor comprises a control terminal coupled to the driving node, a first terminal coupled to the driving node, and a second terminal coupled to the source terminal of the switch device.

According to another embodiment of the invention, the second voltage control circuit comprises a fourteenth diode. The fourteenth diode comprises a fourteenth anode coupled to the driving node and a fourteenth cathode coupled to the source terminal of the switch device. The voltage across the gate terminal to the source terminal of the switch device is clamped at a fourteenth forward voltage of the fourteenth diode.

According to another embodiment of the invention, the second voltage control circuit comprises a fifteenth zener. The fifteenth zener comprises a fifteenth anode coupled to the driving node and a fifteenth cathode coupled to the source terminal of the switch device. The voltage across the gate terminal to the source terminal of the switch device is clamped at a fifteenth forward voltage of the fifteenth zener.

According to another embodiment of the invention, the second voltage control circuit comprises a sixteenth zener. The sixteenth zener comprises a sixteenth anode coupled to the source terminal of the switch device and a sixteenth cathode coupled to the driving node. The voltage across the gate terminal to the source terminal of the switch device is clamped at a sixteenth reverse voltage of the sixteenth zener.

According to another embodiment of the invention, the second voltage control circuit comprises a seventeenth zener and an eighteenth zener. The seventeenth zener comprises a seventeenth anode and a seventeenth cathode coupled to the driving node. The eighteenth zener comprises an eighteenth anode coupled to the seventeenth anode and an eighteenth cathode coupled to the source terminal of the switch device. The voltage across the gate terminal to the source terminal of the switch device is clamped at a sum of a seventeenth reverse voltage of the seventeenth zener and an eighteenth forward voltage of the eighteenth zener.

According to another embodiment of the invention, the second voltage control circuit comprises a nineteenth diode and a twentieth diode. The nineteenth diode comprises a nineteenth anode coupled to the driving node and a nineteenth cathode coupled to the source terminal of the switch device. The twentieth diode comprises a twentieth anode coupled to the source terminal of the switch device and a cathode coupled to the driving node. The voltage across the gate terminal to the source terminal of the switch device is clamped at the nineteenth forward voltage of the nineteenth diode.

According to another embodiment of the invention, the second voltage control circuit comprises a twenty-first zener and a twenty-second zener. The twenty-first zener comprises a twenty-first anode coupled to the driving node and a twenty-first cathode coupled to the source terminal of the switch device. The twenty-second zener comprises a twenty-second anode coupled to the source terminal of the switch device and a twenty-second cathode coupled to the driving node.

According to another embodiment of the invention, the second voltage control circuit comprises a twenty-third diode and an twenty-fourth zener. The twenty-third diode comprises a twenty-third anode coupled to the driving node and a twenty-third cathode. The twenty-fourth zener comprises a twenty-fourth anode coupled to the source terminal of the switch device and a twenty-fourth cathode coupled to the twenty-third cathode. The voltage across the gate terminal to the source terminal of the switch device is clamped at a sum of the twenty-third forward voltage of the twenty-third diode and the twenty-fourth reverse voltage of the eighteenth zener.

According to another embodiment of the invention, the second voltage control circuit comprises a twenty-fifth diode and a twenty-sixth zener. The twenty-fifth diode comprises a twenty-fifth anode coupled to the driving node and a twenty-fifth cathode. The twenty-sixth zener comprises a twenty-sixth anode coupled to the twenty-fifth cathode and a twenty-sixth cathode coupled to the source terminal of the switch device. The voltage across the gate terminal to the source terminal of the switch device is clamped at a sum of the twenty-fifth forward voltage of the twenty-fifth diode and the twenty-sixth forward voltage of the twenty-sixth zener.

According to another embodiment of the invention, the second voltage control circuit comprises a fifth resistor and a sixth bidirectional-conducting device. The fifth resistor is coupled to the source terminal of the switch device. The sixth bidirectional-conducting device is coupled between the fifth resistor and the driving node.

According to another embodiment of the invention, the second voltage control circuit comprises a sixth resistor and a seventh bidirectional-conducting device. The sixth resistor is coupled between the driving node and the source terminal of the switch device. The seventh bidirectional-conducting device is coupled between the driving node and the source terminal of the switch device.

According to another embodiment of the invention, the second voltage control circuit comprises a seventh bidirectional-conducting device, a seventh resistor, and an eighth bidirectional-conducting device. The seventh bidirectional-conducting device is coupled to the driving node. The seventh resistor is coupled between the seventh bidirectional-conducting device and the source terminal of the switch device. The eighth bidirectional-conducting device is coupled between the seventh bidirectional-conducting device and the source terminal of the switch device.

In another embodiment, a power circuit comprises a switch device and a gate-driving circuit. The switch device comprises a gate terminal coupled to a driving node, a drain terminal coupled to a power node, and a source terminal coupled to a low voltage level. The gate-driving circuit turns on and off the switch device. The gate-driving circuit comprises a driving switch and a voltage control circuit. The driving switch comprises a gate terminal coupled to a control node, a drain terminal coupled to the power node, and a source terminal coupled to the driving node. The voltage control circuit is coupled between the control node and the driving node, When a positive pulse is generated at the control node, the voltage control circuit provides the positive pulse to the driving node with a time delay.

According to an embodiment of the invention, when the positive pulse is generated at the control node, a voltage of the control node rises from a low voltage level to a supply voltage so that the driving switch is turned on to provide a power voltage of the power node to the driving node so as to turn on the switch device.

According to an embodiment of the invention, when the voltage of the control node reaches the supply voltage, a driving voltage of the driving node is still in a low voltage level so that the driving switch is turned on due to a voltage difference from the control node to the driving node so as to turn on the switch device.

According to an embodiment of the invention, the switch device is a silicon device.

According to another embodiment of the invention, the switch device is a SiC device.

According to another embodiment of the invention, the switch device is a GaN device.

According to an embodiment of the invention, the driving switch is a silicon device.

According to another embodiment of the invention, the driving switch is a SiC device.

According to another embodiment of the invention, the driving switch is a GaN device.

According to an embodiment of the invention, the voltage control circuit comprises a first resistor. The first resistor is coupled between the control node and the driving node.

According to another embodiment of the invention, the voltage control circuit comprises a transistor. The transistor comprises a control terminal coupled to the control node, a first terminal coupled to the control node, and a second terminal coupled to the driving node.

According to another embodiment of the invention, the voltage control circuit comprises a first diode. The first diode comprises an anode coupled to the control node and a cathode coupled to the driving node.

According to another embodiment of the invention, the voltage control circuit comprises a second zener. The second zener comprises an anode coupled to the control node and a cathode coupled to the driving node.

According to another embodiment of the invention, the voltage control circuit comprises a third zener. The third zener comprises an anode coupled to the driving node and a cathode coupled to the control node.

According to another embodiment of the invention, the voltage control circuit comprises a fourth zener and a fifth zener. The fourth zener comprises an anode and a cathode coupled to the control node. The fifth zener comprises an anode coupled to the anode of the fourth zener and a cathode coupled to the driving node.

According to another embodiment of the invention, the voltage control circuit comprises a sixth diode and a seventh diode. The sixth diode comprises an anode coupled to the control node and a cathode coupled to the driving node. The seventh diode comprises an anode coupled to the driving node and a cathode coupled to the control node.

According to another embodiment of the invention, the voltage control circuit comprises an eighth zener and a ninth zener. The eighth zener comprises an anode coupled to the control node and a cathode coupled to the driving node. The ninth zener comprises an anode coupled to the driving node and a cathode coupled to the control node.

According to another embodiment of the invention, the voltage control circuit comprises a current-control resistor, a first transistor, a second transistor, a third transistor, and a reverse diode. The current-control resistor is coupled to the control node. The first transistor comprises a control terminal coupled to the current-control resistor, a first terminal coupled to the current-control resistor, and a second terminal. The second transistor comprises a control terminal coupled to the second terminal of the first transistor, a first terminal coupled to the second terminal of the first transistor, and a second terminal. The third transistor comprises a control terminal coupled to the second terminal of the second transistor, a first terminal coupled to the second terminal of the second transistor, and a second terminal coupled to the driving node. The reverse diode comprises a reverse anode coupled to the driving node and a reverse cathode coupled to the control node.

According to another embodiment of the invention, the voltage control circuit comprises a tenth diode and an eleventh zener. The tenth diode comprises an anode coupled to the control node and a cathode. The eleventh zener comprises an anode coupled to the driving node and a cathode coupled to the cathode of the tenth diode.

According to another embodiment of the invention, the voltage control circuit comprises a twelfth diode and a thirteenth zener. The twelfth diode comprises an anode coupled to the control node and a cathode. The thirteenth zener comprises an anode coupled to the cathode of the twelfth diode and a cathode coupled to the driving node.

According to another embodiment of the invention, the voltage control circuit comprises a second resistor and a first bidirectional-conducting device. The second resistor is coupled to the driving node. The first bidirectional-conducting device is coupled between the second resistor and the control node.

According to another embodiment of the invention, the voltage control circuit comprises a third resistor and a second bidirectional-conducting device. The third resistor is coupled to the driving node. The second bidirectional-conducting device is coupled between the control node and the driving node.

According to another embodiment of the invention, the voltage control circuit comprises a third bidirectional-conducting device, a fourth resistor, and a fourth bidirectional-conducting device. The third bidirectional-conducting device is coupled to the control node. The fourth resistor is coupled between the third bidirectional-conducting device and the driving node. The fourth bidirectional-conducting device is coupled between the third bidirectional-conducting device and the driving node.

According to another embodiment of the invention, the gate-driving circuit further comprises a second voltage control circuit. The second voltage control circuit is coupled between the driving node and the source terminal of the switch device and configured to clamp a voltage from the gate terminal to the source terminal of the switch device.

According to an embodiment of the invention, the second voltage control circuit comprises a fourth transistor. The fourth transistor comprises a control terminal coupled to the driving node, a first terminal coupled to the driving node, and a second terminal coupled to the source terminal of the switch device.

According to another embodiment of the invention, the second voltage control circuit comprises a fourteenth diode. The fourteenth diode comprises a fourteenth anode coupled to the driving node and a fourteenth cathode coupled to the source terminal of the switch device. The voltage across the gate terminal to the source terminal of the switch device is clamped at a fourteenth forward voltage of the fourteenth diode.

According to another embodiment of the invention, the second voltage control circuit comprises a fifteenth zener. The fifteenth zener comprises a fifteenth anode coupled to the driving node and a fifteenth cathode coupled to the source terminal of the switch device. The voltage across the gate terminal to the source terminal of the switch device is clamped at a fifteenth forward voltage of the fifteenth zener.

According to another embodiment of the invention, the second voltage control circuit comprises a sixteenth zener. The sixteenth zener comprises a sixteenth anode coupled to the source terminal of the switch device and a sixteenth cathode coupled to the driving node. The voltage across the gate terminal to the source terminal of the switch device is clamped at a sixteenth reverse voltage of the sixteenth zener.

According to another embodiment of the invention, the second voltage control circuit comprises a seventeenth zener and an eighteenth zener. The seventeenth zener comprises a seventeenth anode and a seventeenth cathode coupled to the driving node. The eighteenth zener comprises an eighteenth anode coupled to the seventeenth anode and an eighteenth cathode coupled to the source terminal of the switch device. The voltage cross the gate terminal to the source terminal of the switch device is clamped at a sum of a seventeenth reverse voltage of the seventeenth zener and an eighteenth forward voltage of the eighteenth zener.

According to another embodiment of the invention, the second voltage control circuit comprises a nineteenth diode and a twentieth diode. The nineteenth diode comprises a nineteenth anode coupled to the driving node and a nineteenth cathode coupled to the source terminal of the switch device. The twentieth diode comprises a twentieth anode coupled to the source terminal of the switch device and a cathode coupled to the driving node. The voltage across the gate terminal to the source terminal of the switch device is clamped at the nineteenth forward voltage of the nineteenth diode.

According to another embodiment of the invention, the second voltage control circuit comprises a twenty-first zener and a twenty-second zener. The twenty-first zener comprises a twenty-first anode coupled to the driving node and a twenty-first cathode coupled to the source terminal of the switch device. The twenty-second zener comprises a twenty-second anode coupled to the source terminal of the switch device and a twenty-second cathode coupled to the driving node.

According to another embodiment of the invention, the second voltage control circuit comprises a twenty-third diode and an twenty-fourth zener. The twenty-third diode comprises a twenty-third anode coupled to the driving node and a twenty-third cathode. The twenty-fourth zener comprises a twenty-fourth anode coupled to the source terminal of the switch device and a twenty-fourth cathode coupled to the twenty-third cathode. The voltage across the gate terminal to the source terminal of the switch device is clamped at a sum of the twenty-third forward voltage of the twenty-third diode and the twenty-fourth reverse voltage of the eighteenth zener.

According to another embodiment of the invention, the second voltage control circuit comprises a twenty-fifth diode and a twenty-sixth zener. The twenty-fifth diode comprises a twenty-fifth anode coupled to the driving node and a twenty-fifth cathode. The twenty-sixth zener comprises a twenty-sixth anode coupled to the twenty-fifth cathode and a twenty-sixth cathode coupled to the source terminal of the switch device. The voltage across the gate terminal to the source terminal of the switch device is clamped at a sum of the twenty-fifth forward voltage of the twenty-fifth diode and the twenty-sixth forward voltage of the twenty-sixth zener.

According to another embodiment of the invention, the second voltage control circuit comprises a fifth resistor and a sixth bidirectional-conducting device. The fifth resistor is coupled to the source terminal of the switch device. The sixth bidirectional-conducting device is coupled between the fifth resistor and the driving node.

According to another embodiment of the invention, the second voltage control circuit comprises a sixth resistor and a seventh bidirectional-conducting device. The sixth resistor is coupled between the driving node and the source terminal of the switch device. The seventh bidirectional-conducting device is coupled between the driving node and the source terminal of the switch device.

According to another embodiment of the invention, the second voltage control circuit comprises a seventh bidirectional-conducting device, a seventh resistor, and an eighth bidirectional-conducting device. The seventh bidirectional-conducting device is coupled to the driving node. The seventh resistor is coupled between the seventh bidirectional-conducting device and the source terminal of the switch device. The eighth bidirectional-conducting device is coupled between the seventh bidirectional-conducting device and the source terminal of the switch device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
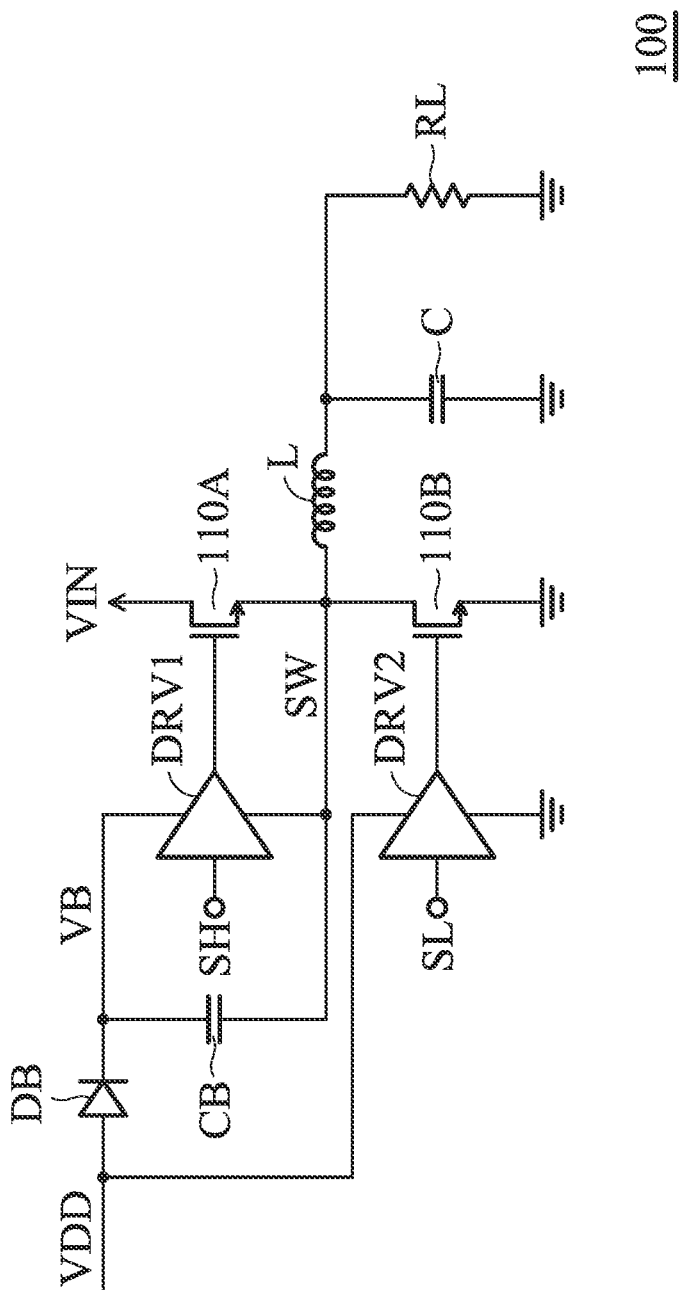
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate relationship between the various embodiments and/or configurations discussed. The scope of the invention is best determined by reference to the appended claims.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
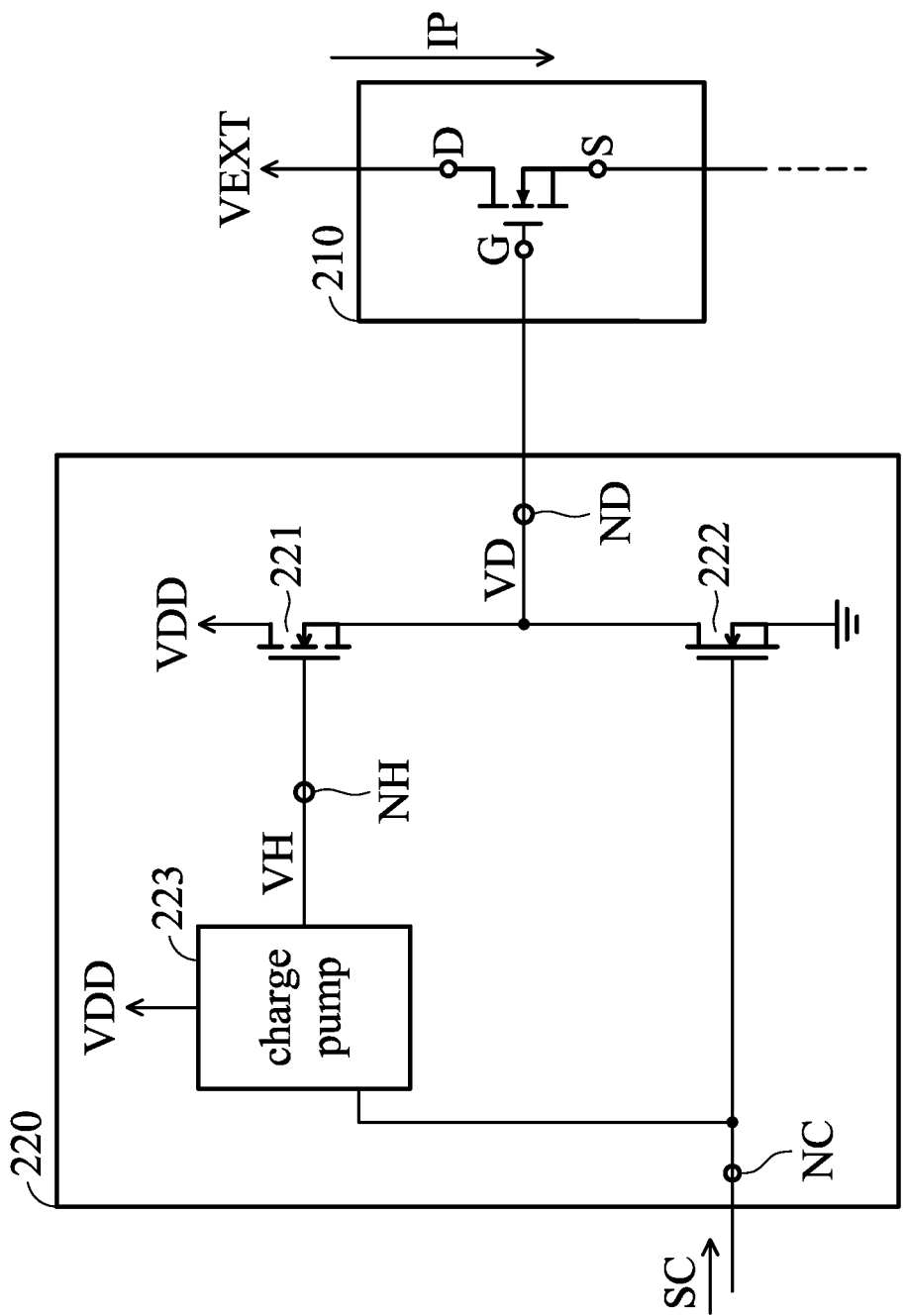
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a switch device 210 and a gate-driving circuit 220. According to an embodiment of the invention, the switch device 210 corresponds to the first switch device 110A. According to an embodiment of the invention, the gate-driving circuit 220 corresponds to the high-side driver DRV1 in FIG. 1, and the switch device 210 corresponds to the first switch device 110A in FIG. 1.

The switch device 210 generates the power current IP flowing from the external voltage VEXT to the source terminal S of the switch device 210 according to the driving voltage VD of the driving node ND. According to an embodiment of the invention, the switch device 210 is a silicon transistor. According to another embodiment of the invention, the switch device 210 is a SiC transistor. According to another embodiment of the invention, the switch device 210 is a GaN transistor.

The gate-driving circuit 220 includes a high-side transistor 221, a low-side transistor 222, and a charge pump 223. The high-side transistor 221 supplies the supply voltage VDD to the driving node ND according to the high-side voltage VH of the high-side node NH. The low-side transistor 222 is coupled between the driving node ND and the low voltage level, and configured to pull the driving voltage VD down to the low voltage level according to the control signal SC. According to an embodiment of the invention, the high-side transistor 221 and the low-side transistor 222 are normally-off transistors. According to some embodiments of the invention, the low voltage level may be any voltage selected by the designer. As illustrated herein, the low voltage level is illustrated as the ground, but not intended to be limited thereto.

The charge pump 223 is supplied by the supply voltage VDD. For the sake of fully turning on the high-side transistor 221, the charge pump 223 is configured to generate the high-side voltage VH exceeding the supply voltage VDD, such that the gate-to-source voltage of the high-side transistor 221 at least exceeds the threshold voltage to apply the supply voltage VDD to the driving node ND.

Figure 3:
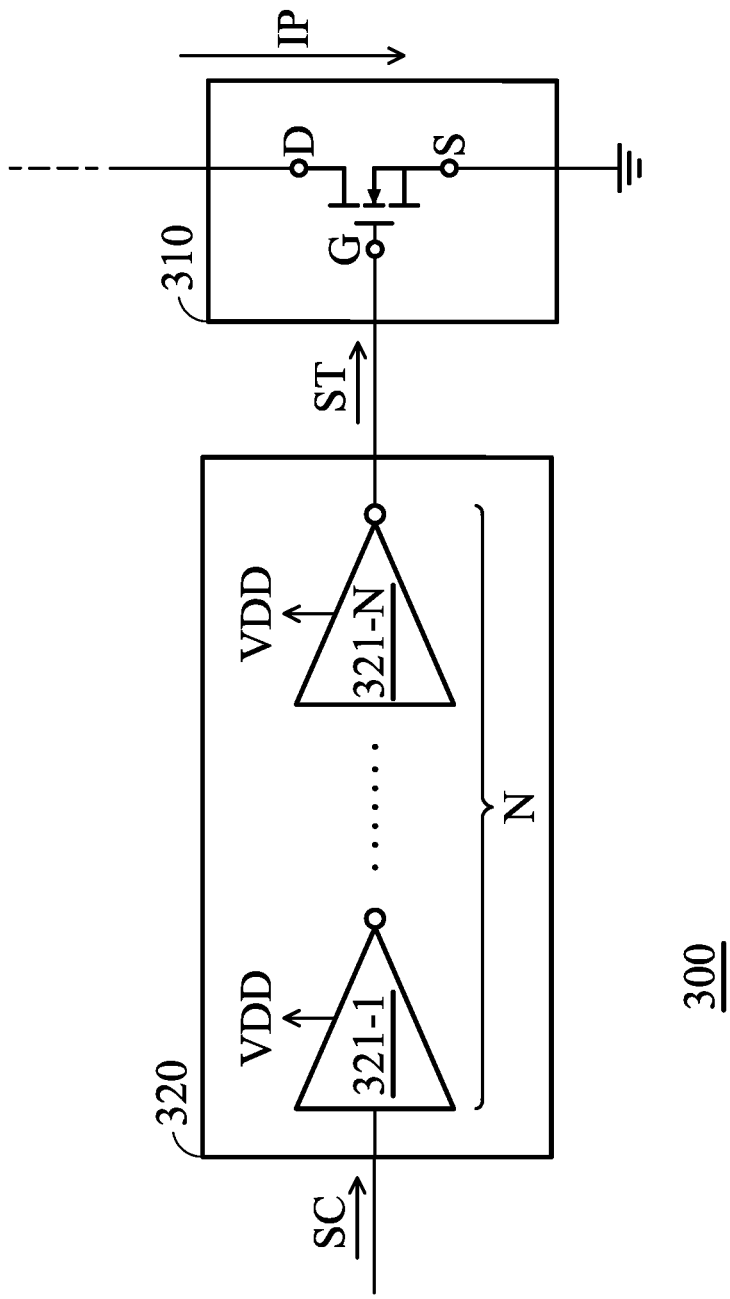
FIG. 3 is a block diagram of a power circuit in accordance with another embodiment of the invention.

FIG. 3 is a block diagram of a power circuit in accordance with another embodiment of the invention. As shown in FIG. 3, the power circuit 300 includes a switch device 310 and a gate-driving circuit 320. According to an embodiment of the invention, the switch device 310 corresponds to the second switch device 110B. According to an embodiment of the invention, the gate-driving circuit 320 corresponds to the low-side driver DRV2 in FIG. 1, and the switch device 310 corresponds to the second switch device 110B in FIG. 1.

The switch device 310 generates the power current IP flowing from the drain terminal D of the switch device 310 to the low voltage level according to the trigger signal ST. According to an embodiment of the invention, the switch device 310 is a silicon transistor. According to another embodiment of the invention, the switch device 310 is a SiC transistor. According to another embodiment of the invention, the switch device 310 is a GaN transistor.

The gate-driving circuit 320 generates the trigger signal ST according to the control signal SC, which includes a number of inverters 321-1~321-N. Each of the inverters 321-1~321-N is supplied by the supply voltage VDD. According to an embodiment of the invention, N is an even number so that the trigger signal ST and the control signal SC are in-phase.

As stated above, each of the first switch device 110A and the second switch device 110B in FIG. 1 is driven 1w a plurality of transistors and supplied by the supply voltage VDD. Specifically, the high-side driver DRV1 requires a charge pump to generate the boost voltage VB in order to fully turn on the first switch device 110A. In other words, the first switch device 110A and the second switch device 110B each still needs a driver to boost the current driving capability of the logic signal SL and even to convert the voltage levels of the logic signal SL, which may leads to area consuming, cost increasing, and power consuming.

Figure 4:
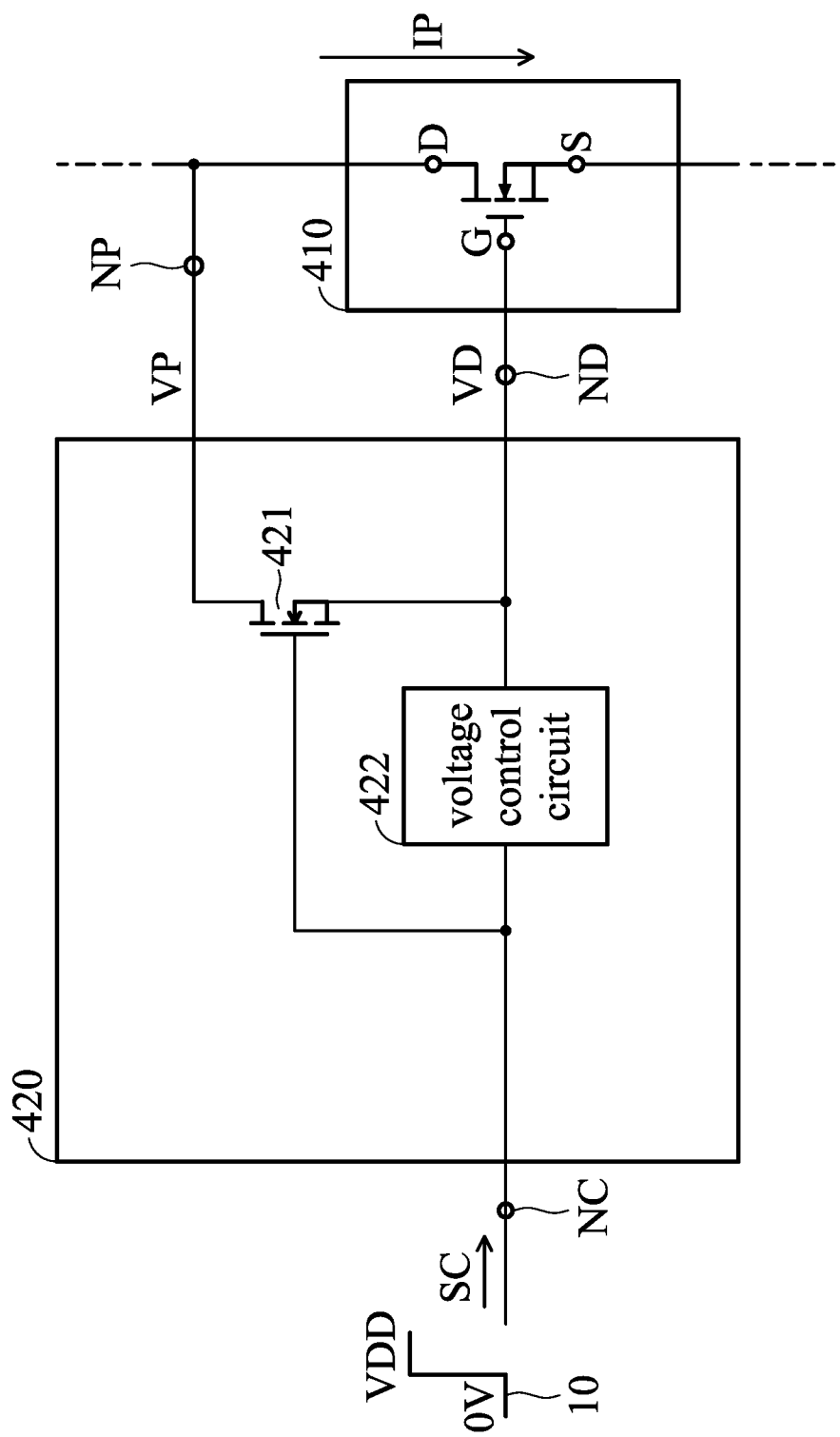
FIG. 4 is a block diagram of a power circuit in accordance with an embodiment of the invention.

FIG. 4 is a block diagram of a power circuit in accordance with an embodiment of the invention. As shown in FIG. 4, the power circuit 400 includes a switch device 410 and a gate-driving circuit 420. The switch device 410 generates a power current IP flowing from the power node NP to the source terminal S of the switch device 410 according to the driving voltage VD of the driving node ND, in which the drain terminal D of the switch device 410 is coupled to the power node NP.

The gate-driving circuit 420 includes a driving switch 421 and a voltage control circuit 422. The driving switch 421 includes a gate terminal coupled to a control node NC, a drain terminal coupled to the power node NP, and a source terminal coupled to the driving node ND. The voltage control circuit 422 is coupled between the control node NC and the driving node ND. According to an embodiment of the invention, when the control signal SC generates a positive pulse 10 at the control node NC, the voltage control circuit 422 provides the positive pulse 10 to the driving node ND with a time delay.

More specifically, when the control signal SC generates the positive pulse 10 at the control node NC, the positive pulse 10 at the control node NC rises from a low voltage level to a supply voltage VDD. Since the voltage control circuit 422 provides the positive pulse 10 to the driving node ND with a time delay, the driving voltage VD keeps in the low voltage level for a period once the control signal SC rises from the low voltage level to the supply voltage VDD. Therefore, the driving switch 421 is turned on by the voltage difference from the control node NC to the driving node ND.

When the driving switch 421 is turned on, the driving switch 421 pulls the driving voltage VD up to the supply voltage VDD so as to turn on the switch device 410. When the driving voltage VD reaches the supply voltage VDD, the driving switch 421 is cut off so as to protect the driving node ND from the power voltage VP of the power node NP. According to an embodiment of the invention, the supply voltage VDD of the positive pulse 10 is less than the power voltage VP. According to other embodiments of the invention, the power voltage VP may be equal to, or less than, the supply voltage VDD. According to an embodiment of the invention, the gate-driving circuit 420 is a self-driven circuit without a supply voltage since the gate-driving circuit 420 introduces the power voltage VP to drive the switch device 410 instead of a supply voltage for powering the gate-driving circuit 420.

According to an embodiment of the invention, the driving switch 421 is a silicon device. According to another embodiment of the invention, the driving switch 421 is a SiC device. According to another embodiment of the invention, the driving switch 421 is a GaN device.

According to an embodiment of the invention, the switch device 410 corresponds to the switch device 210 in FIG. 2, and the gate-driving circuit 220 in FIG. 2 may be replaced with the gate-driving circuit 420. It is obvious that the gate-driving 420 does not need the charge pump 223 which is chip area consuming. In addition, the gate-driving 420 does not require to be supplied by the supply voltage VDD, which leads to power consumption reduction.

According to another embodiment of the invention, the switch device 410 corresponds to the switch device 310 in FIG. 3, and the gate-driving circuit 320 in FIG. 3 may be replaced with the gate-driving circuit 420. It is obvious that the chip area of the gate-driving circuit 420 has been greatly reduced, compared to the gate-driving circuit 320. In addition, the gate-driving 420 does not require to be supplied by the supply voltage VDD, which leads to power consumption reduction.

Figure 5:
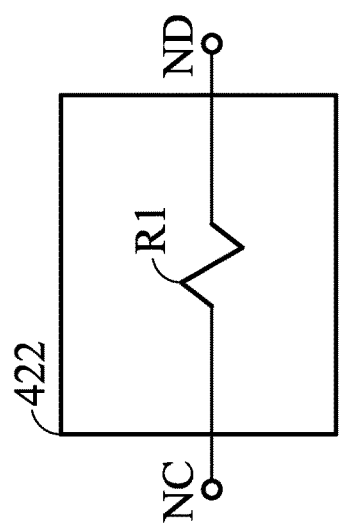
FIG. 5 is a block diagram of a voltage control circuit in accordance with an embodiment of the invention.

FIG. 5 is a block diagram of a voltage control circuit in accordance with an embodiment of the invention. As shown in FIG. 5, the voltage control circuit 422 includes a first resistor R1. The first resistor R1 is coupled between the control node NC and the driving node ND.

According to an embodiment of the invention, when the control signal SC generates the positive pulse 10 at the control node NC, the first resistor R1 and the parasitic capacitance at the gate terminal G of the switch device 410 generates a time delay so that the driving voltage VD responses to the positive pulse 10 later than the control node NC does.

According to another embodiment of the invention, when the control signal SC generates a negative pulse at the control node NC (i.e., falling from the supply voltage VDD to the low voltage level), the driving node ND is discharged through the first resistor R1 to the low voltage level.

Figure 6:
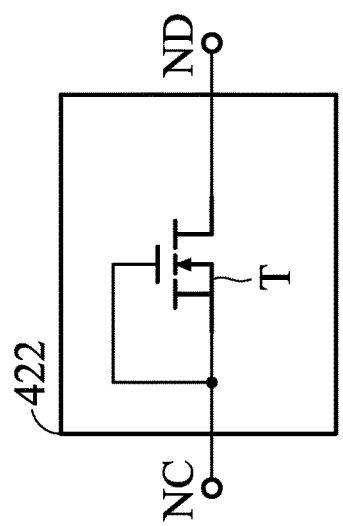
FIG. 6 is a block diagram of a voltage control circuit in accordance with another embodiment of the invention.

FIG. 6 is a block diagram of a voltage control circuit in accordance with another embodiment of the invention. As shown in FIG. 6, the voltage control circuit 422 includes a transistor T. The transistor T includes a control terminal coupled to the control node NC, a first terminal coupled to the control node NC, and a second terminal coupled to the driving node ND.

According to an embodiment of the invention, when the control signal SC generates the positive pulse 10 at the control node NC, the transistor T is turned on so that the on-resistance of the transistor T and the parasitic capacitance at the gate terminal G of the switch device 410 generates a time delay. Therefore, the driving voltage VD responses to the positive pulse 10 later than the control node NC does.

According to another embodiment of the invention, when the control signal SC generates a negative pulse at the control node NC (i.e., falling from the supply voltage VDD to the low voltage level), the driving node ND is discharged through the leakage current of the transistor T to the low voltage level.

Figure 7:
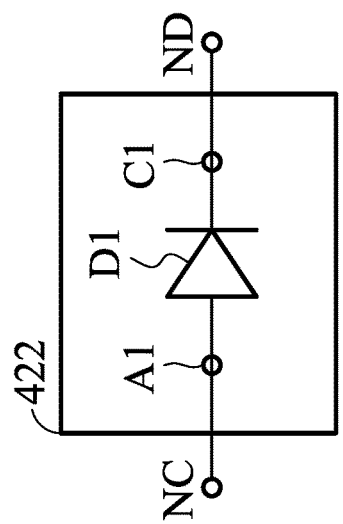
FIG. 7 is a block diagram of a voltage control circuit in accordance with another embodiment of the invention.

FIG. 7 is a block diagram of a voltage control circuit in accordance with another embodiment of the invention. As shown in FIG. 7, the voltage control circuit 422 includes a first diode D1. The first diode D1 includes a first anode A1 coupled to the control node NC and a first cathode C1 coupled to the driving node ND.

According to an embodiment of the invention, when the control signal SC generates the positive pulse 10 at the control node NC, the first diode D1 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the reverse leakage current of the first diode Dl to the low voltage level.

Figure 8:
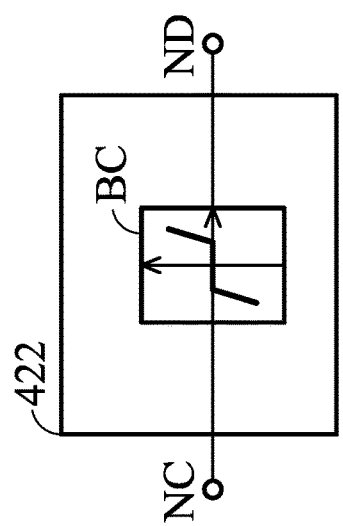
FIG. 8 is a block diagram of a voltage control circuit in accordance with another embodiment of the invention.

FIG. 8 is a block diagram of a voltage control circuit in accordance with another embodiment of the invention. As shown in FIG. 8, the voltage control circuit 422 includes a bidirectional-conducting device BC. The bidirectional-conducting device BC is coupled between the control node NC and the driving node ND.

According to an embodiment of the invention, when the control signal SC generates the positive pulse 10 at the control node NC, the bidirectional-conducting device BC needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving lode ND is discharged through the bidirectional-conducting device BC to the low voltage level.

Figure 9:
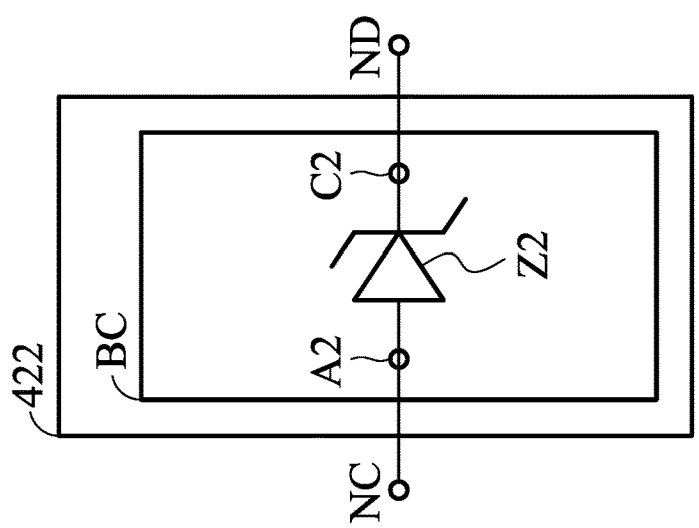
FIG. 9 is a block diagram of a bidirectional-conducting device circuit in accordance with another embodiment of the invention.

FIG. 9 is a block diagram of a bidirectional-conducting device circuit accordance with another embodiment of the invention. As shown in FIG. 9, the bidirectional-conducting device BC includes a second zener Z2. The second zener Z2 includes a second anode A2 coupled to the control node NC and a second cathode C2 coupled to the driving node ND.

According to an embodiment of the invention, when the control signal SC generates the positive pulse 10 at the control node NC, the second zener Z2 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the second zener Z2 to the low voltage level.

Figure 10:
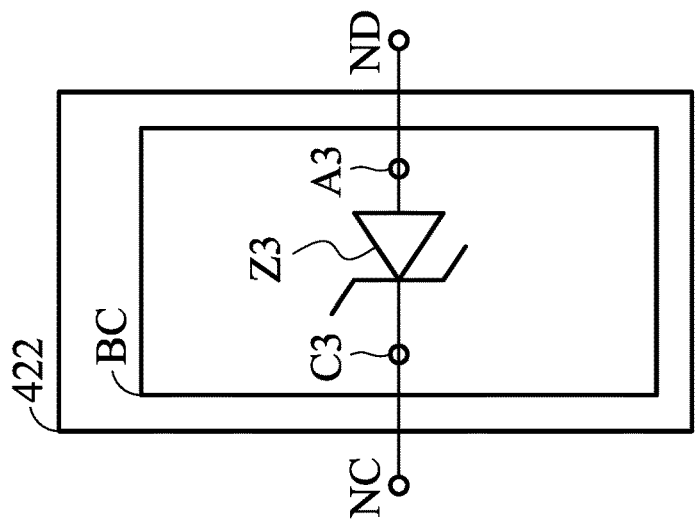
FIG. 10 is a block diagram of a bidirectional-conducting device circuit in accordance with another embodiment of the invention.

FIG. 10 is a block diagram of a bidirectional-conducting device circuit in accordance with another embodiment of the invention. As shown in FIG. 10, the bidirectional-conducting device BC includes a third zener Z3. The third zener Z3 includes a third anode A3 coupled to the driving node ND and a third cathode C3 coupled to the control node NC.

According to an embodiment of the invention, when the control signal SC generates the positive pulse 10 at the control node NC, the third zener Z3 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the third zener Z3 to the low voltage level.

Figure 11:
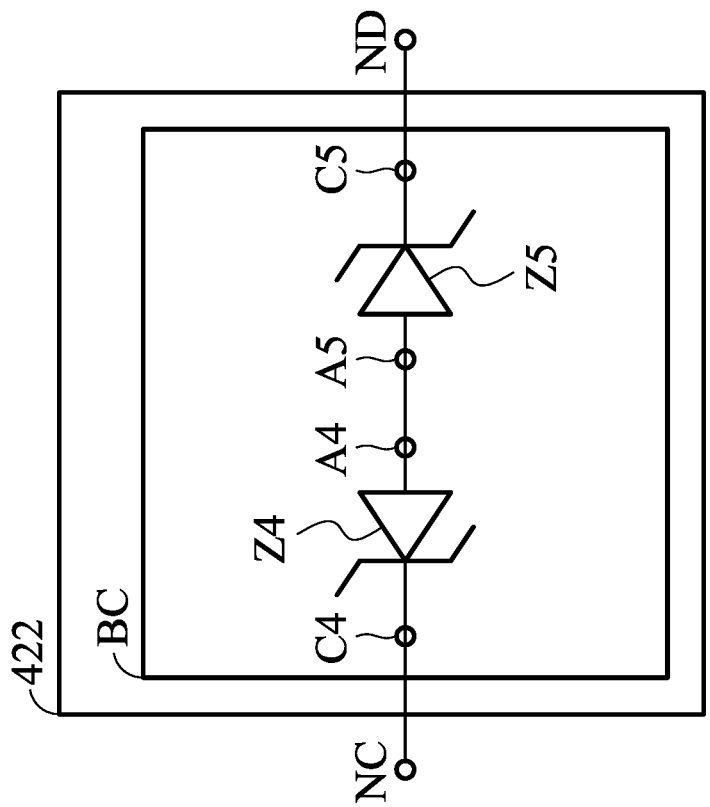
FIG. 11 is a block diagram of a bidirectional-conducting device circuit in accordance with another embodiment of the invention.

FIG. 11 is a block diagram of a bidirectional-conducting device circuit in accordance with another embodiment of the invention. As shown in FIG. 11, the bidirectional-conducting device BC includes a fourth zener Z4 and a fifth zener Z5. The fourth zener Z4 includes a fourth anode A4 and a fourth cathode C4 coupled to the control node NC. The fifth zener Z5 includes a fifth anode A5 coupled to the fourth anode A4 and a fifth cathode C5 coupled to the driving node ND.

According to an embodiment of the invention, when the control signal SC generates the positive pulse 10 at the control node NC, the fourth zener Z4 and the fifth zener Z5 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the fourth zener Z4 and the fifth zener Z5 to the low voltage level.

Figure 12:
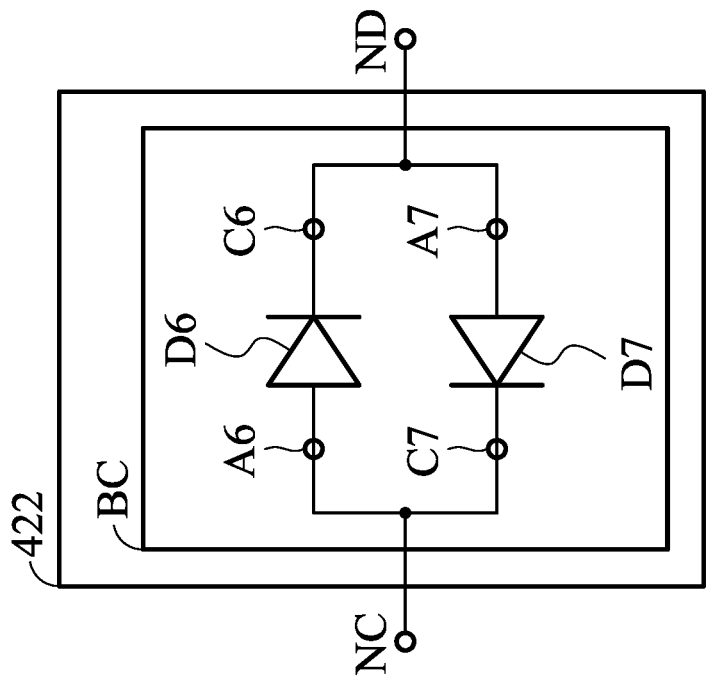
FIG. 12 is a block diagram of a bidirectional-conducting device circuit in accordance with another embodiment of the invention.

FIG. 12 is a block diagram of a bidirectional-conducting device circuit in accordance with another embodiment of the invention. As shown in FIG. 12, the bidirectional-conducting device BC includes a sixth diode D6 and a seventh diode D7. The sixth diode D6 includes a sixth anode A6 coupled to the control node NC and a sixth cathode C6 coupled to the driving node ND. The seventh diode D7 includes a seventh anode A7 coupled to the driving node ND and a seventh cathode C7 coupled to the control node NC.

According to an embodiment of the invention, when the control signal SC generates the positive pulse 10 at the control node NC, the sixth diode D6 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the seventh diode D7 to the low voltage level.

Figures 13, 14:
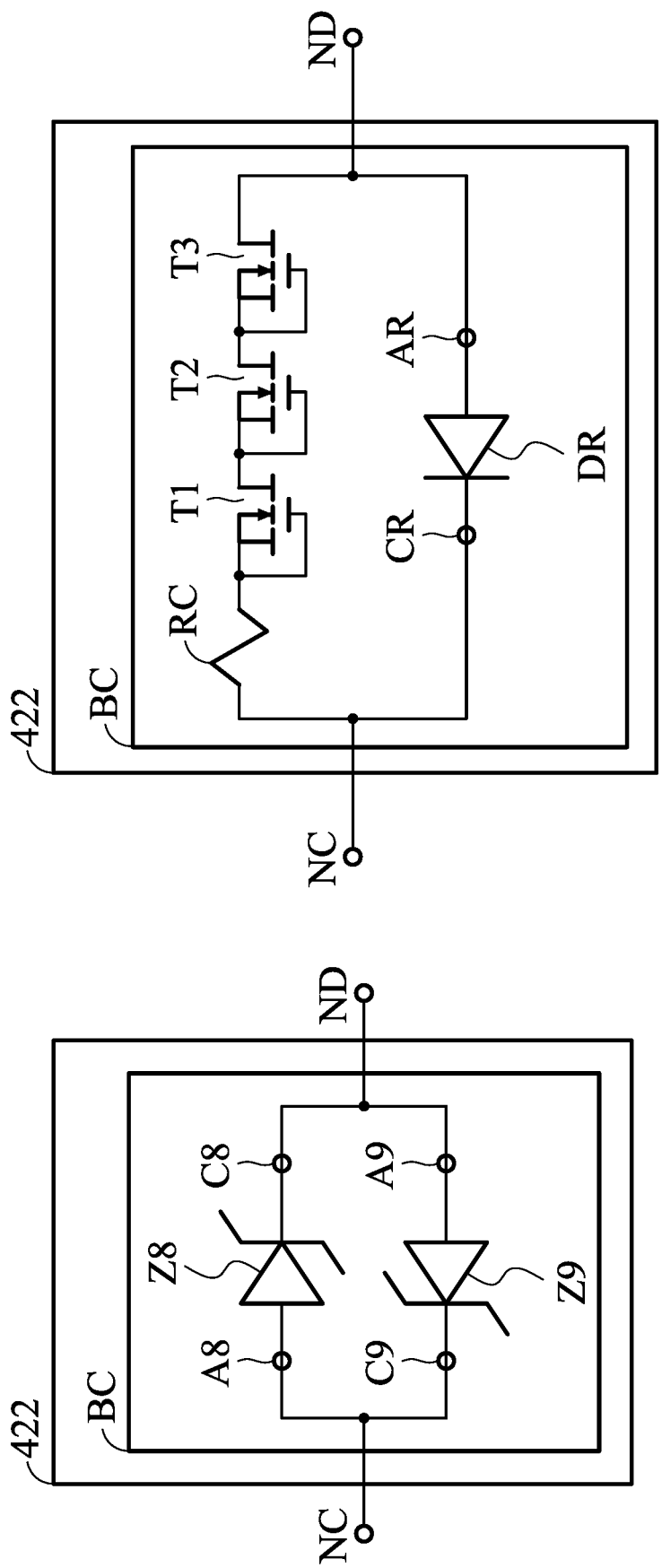
FIG. 13 is a block diagram of a bidirectional-conducting device circuit in accordance with another embodiment of the invention.
FIG. 14 is a block diagram of a bidirectional-conducting device circuit in accordance with another embodiment of the invention.

FIG. 13 is a block diagram of a bidirectional-conducting device circuit in accordance with another embodiment of the invention. As shown in FIG. 13, the bidirectional-conducting device BC includes an eighth zener 78 and a ninth diode D9. The eighth zener 78 includes an eighth anode A8 coupled to the control node NC and an eighth cathode C8 coupled to the driving node ND. The ninth zener 79 includes a ninth anode A9 coupled to the driving node ND and a ninth cathode C9 coupled to the control node NC.

According to an embodiment of the invention, when the control signal SC generates the positive pulse 10 at the control node NC, the eighth zener 78 needs a response time to turn on so that the driving switch 421 is turned on by the voltage difference from the control node NC to the driving node ND.

According to another embodiment of the invention, when the control signal SC generates a negative pulse at the control node NC (i.e., falling from the supply voltage VDD to the low voltage level), the driving node ND is discharged through the ninth zener Z9 to the low voltage level.

FIG. 14 is a block diagram of a bidirectional-conducting device circuit in accordance with another embodiment of the invention. As shown in FIG. 14, the bidirectional-conducting device BC includes a first transistor T1, a second transistor T2, a third transistor T3, a current-control resistor RC, and a reverse diode DR. Each of the first transistor T1, the second transistor T2, and the third transistor T3 is a diode-connected transistor and utilized as a diode.

The first transistor T1 includes a control terminal coupled to the current-control control resistor RC, a first terminal coupled to the current-control resistor RC, and a second terminal. The second transistor T2 includes a control terminal coupled to the second terminal of the first transistor T1, a first terminal coupled to the second terminal of the first transistor T1 and a second terminal. The third transistor T3 includes a control terminal coupled to the second terminal of the second transistor T2, a first terminal coupled to the second terminal of the first transistor T2, and a second terminal coupled to the driving node ND. According to other embodiments of the invention, any one of the first transistor T1, the second transistor T2 and the third transistor T3 may be replaced by a diode.

The current-control resistor RC is coupled between the control node NC and the first transistor T1, which is configured to control the current flowing through the first transistor T1 the second transistor T2, and the third transistor T3. The reverse diode DR includes a reverse anode AR and a reverse cathode CR, in which the reverse anode AR is coupled to the driving node ND and the reverse cathode CR is coupled to the control node NC.

Figure 15:
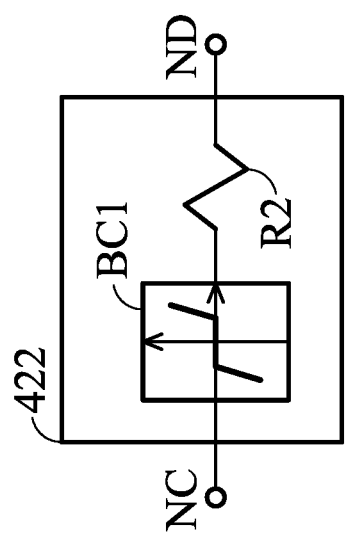
FIG. 15 is a block diagram of a voltage control circuit in accordance with another embodiment of the invention.

FIG. 15 is a block diagram of a voltage control circuit in accordance with another embodiment of the invention. As show in FIG. 15, the voltage control circuit 422 includes a second resistor R2 and a first bidirectional-conducting device BC1. The second resistor R2 is coupled to the driving node ND. The first bidirectional-conducting device BC1 is coupled between the control node NC and the second resistor R2. According to some embodiments of the invention, the first bidirectional-conducting device BC1 may be implemented by the bidirectional-conducting device BC as shown in FIGS. 9-14.

Figure 16:
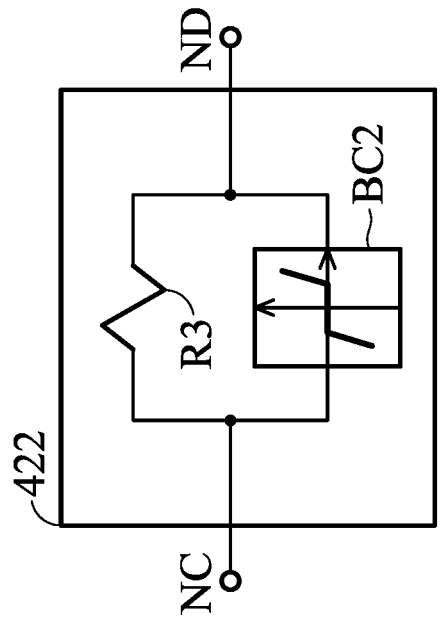
FIG. 16 is a block diagram of a voltage control circuit in accordance with another embodiment of the invention.

FIG. 16 is a block diagram of a voltage control circuit accordance another embodiment of the invention. As shown in FIG. 16, the voltage control circuit 422 includes a third resistor R3 and a second bidirectional-conducting device BC2. The third resistor R3 is coupled between the control node NC and the driving node ND. The second bidirectional-conducting device BC2 is coupled between the control node NC and the driving node ND. According to some embodiments of the invention, the second bidirectional-conducting device BC2 may be implemented by the bidirectional-conducting device BC as shown in FIGS. 9-14.

Figure 17:
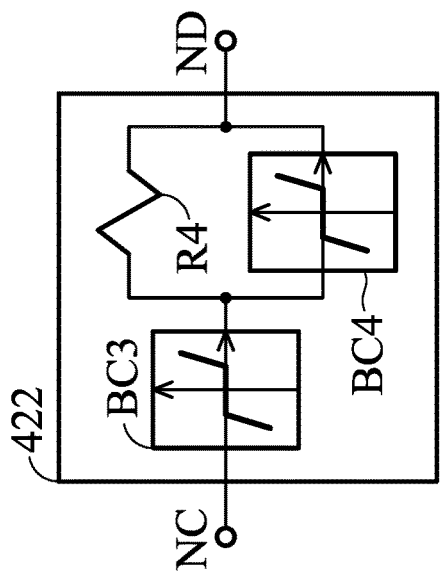
FIG. 17 is a block diagram of a voltage control circuit in accordance with another embodiment of the invention.

FIG. 17 is a block diagram of a voltage control circuit in accordance with another embodiment of the invention. As shown in FIG. 17, the voltage control circuit 422 includes a third bidirectional-conducting device BC3, a fourth resistor R4, and a fourth bidirectional-conducting device BC4. The third bidirectional-conducting device BC3 is coupled to the control node NC. The fourth resistor R4 is coupled between the third bidirectional-conducting device BC3 and the driving node ND. The fourth bidirectional-conducting device BC4 is coupled between the third bidirectional-conducting device BC3 and the driving node ND. According to some embodiments of the invention, any one of the third bidirectional-conducting device BC3 and the fourth bidirectional-conducting device BC4 may be implemented by the bidirectional-conducting device BC as shown in FIGS. 9-14.

Figure 18:
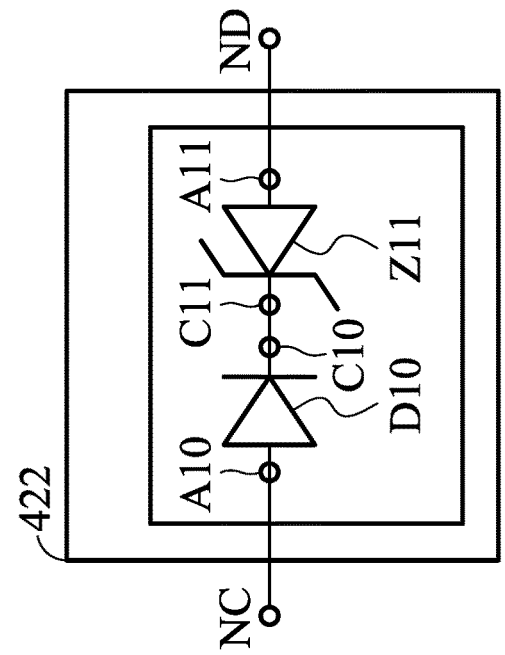
FIG. 18 is a block diagram of a voltage control circuit in accordance with another embodiment of the invention.

FIG. 18 is a block diagram of a voltage control circuit in accordance with another embodiment of the invention. As shown in FIG. 18, the voltage control circuit 422 includes a tenth diode D10 and an eleventh zener Z11. The tenth diode D10 includes a tenth anode A10 coupled to the control node NC and a tenth cathode C10. The eleventh zener Z11 includes an eleventh anode A11 coupled to the driving node ND and an eleventh cathode C11 coupled to the tenth cathode C10.

According to an embodiment of the invention, when the control signal SC generates the positive pulse 10 at the control node NC, the tenth diode D10 and the eleventh zener Z11 need a response time to turn on so that the driving switch 421 is turned on by the voltage difference from the control node NC to the driving node ND, According to another embodiment of the invention, when the control signal SC generates a negative pulse at the control node NC (i.e., falling from the supply voltage VDD to the low voltage level), the driving node ND is discharged through the leakage current of the tenth diode D10 and the eleventh zener Z11 to the low voltage level.

Figure 19:
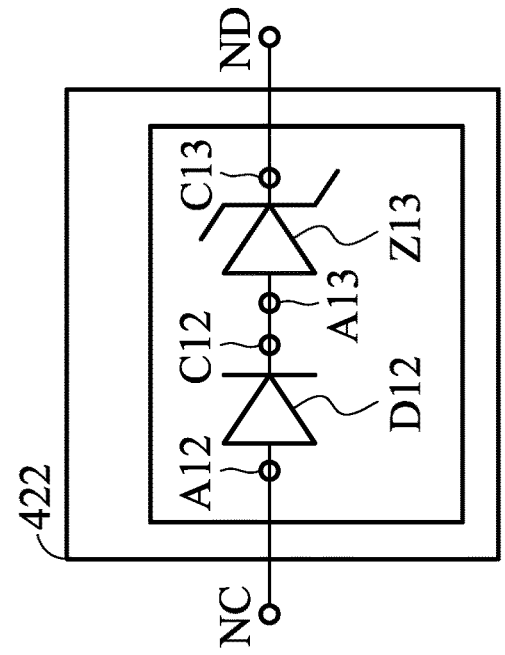
FIG. 19 is a block diagram of a voltage control circuit in accordance with another embodiment of the invention.

FIG. 19 is a block diagram of a voltage control circuit in accordance with another embodiment of the invention. As shown in FIG. 19, the voltage control circuit 422 includes a twelfth diode D12 and a thirteenth zener 713. The twelfth diode D12 includes a twelfth anode A12 coupled to the control node NC and a twelfth cathode C12. The thirteenth zener Z13 includes a thirteenth anode A13 coupled to the twelfth cathode C12 and a thirteenth cathode C13 coupled to the driving node ND.

According to an embodiment of the invention, when the control signal SC generates the positive pulse 10 at the control node NC, the twelfth diode D12 and the thirteenth zener 713 need a response time to turn on so that the driving switch 421 is turned on by the voltage difference from the control node NC to the driving node ND. According to another embodiment of the invention, when the control signal SC generates a negative pulse at the control node NC (i.e., falling from the supply voltage VDD to the low voltage level), the driving node ND is discharged through the leakage current of the twelfth diode D12 and the thirteenth zener 713 to the low voltage level.

Figure 20:
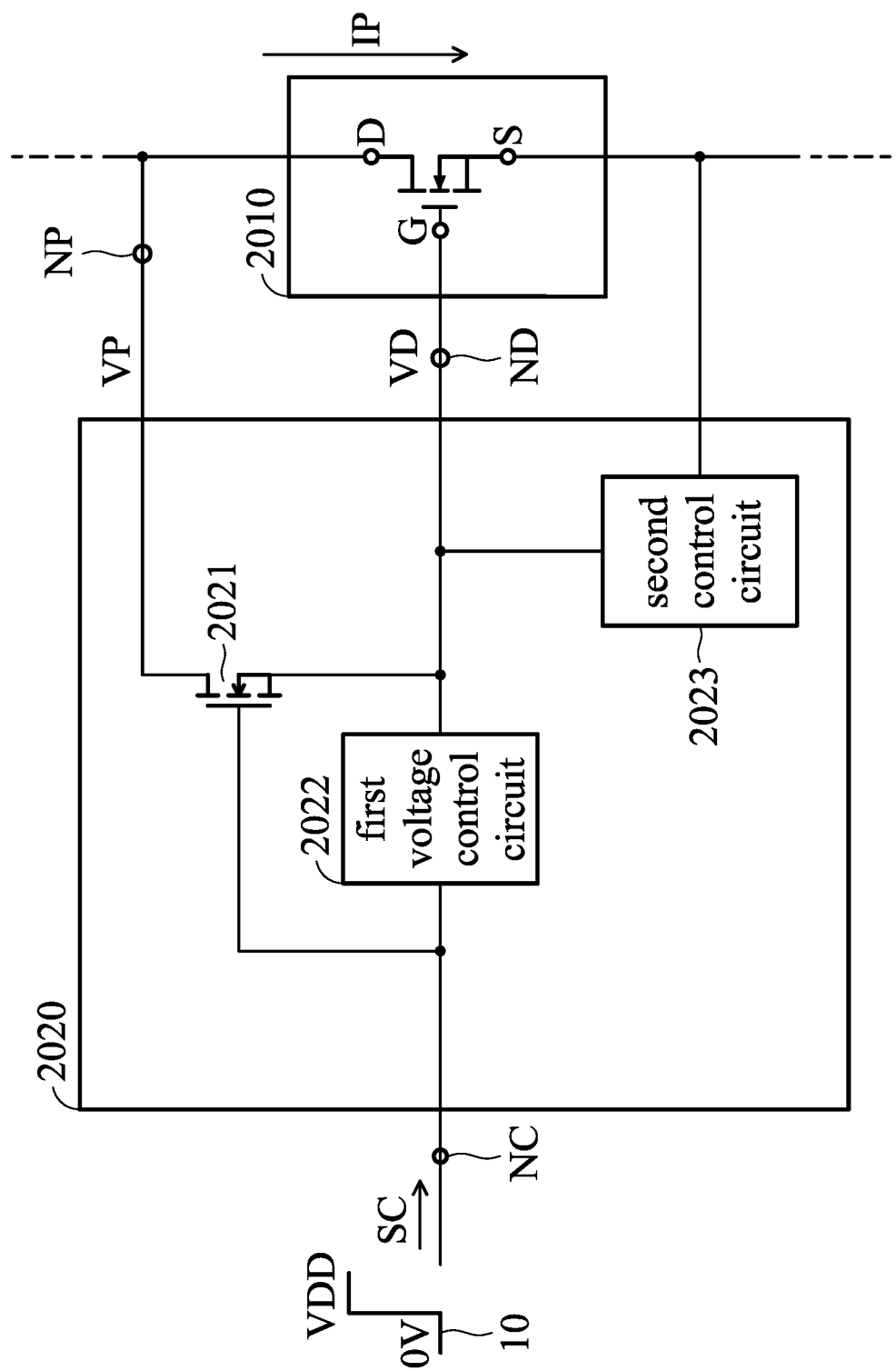
FIG. 20 is a block diagram of a power circuit in accordance with another embodiment of the invention.

FIG. 20 is a block diagram of a power circuit in accordance with another embodiment of the invention. As shown in FIG. 20, the power circuit 2000 includes a switch device 2010 and a gate-driving circuit 2020. The switch device 2010 generates a power current IP flowing from the power node NP to the source terminal S of the switch device 2010 according to the driving voltage VD of the driving node ND, in which the drain terminal D of the switch device 2010 is coupled to the power node NP.

The gate-driving circuit 2020 includes a driving switch 2021, a first voltage control circuit 2022, and a second voltage control circuit 2023. The driving switch 2021 includes a gate terminal coupled to a control node NC, a drain terminal coupled to the power node NP, and a source terminal coupled to the driving node ND.

The first voltage control circuit 2022 is coupled between the control node NC and the driving node ND. According to an embodiment of the invention, when the control signal SC generates a positive pulse 10 at the control node NC, the first voltage control circuit 2022 provides the positive pulse 10 to the driving node ND with a time delay. According to some embodiments of the invention, the first voltage control circuit 2022 may be implemented by the voltage control circuit 422 shown in FIGS. 5-19, which will not be repeated herein.

The second voltage control circuit 2023 is coupled between the driving node ND and the source terminal S of the switch device 2010. The second voltage control circuit 2023 is configured to clamp a voltage from the gate terminal G to the source terminal S of the switch device 2010.

Figure 21:
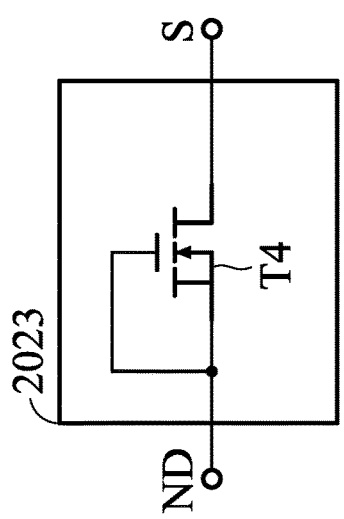
FIG. 21 is a block diagram of a second voltage control circuit in accordance with an embodiment of the invention.

FIG. 21 is a block diagram of a second voltage control circuit in accordance with an embodiment of the invention. As shown in FIG. 21, the second voltage control circuit 2023 includes a fourth transistor T4. The fourth transistor T4 includes a control terminal coupled to the driving node ND, a first terminal coupled to the driving node ND, and a second terminal coupled to the source terminal S of the switch device 2010.

According to an embodiment of the invention, when the voltage across the gate terminal G to the source terminal S of the switch device 2010 exceeds the threshold voltage of the fourth transistor T4, the fourth transistor T4 is turned on so that the fourth transistor T4 clamps the voltage across the gate terminal G to the source terminal S of the switch device 2010 at the threshold voltage of the fourth transistor T4.

Figure 22:
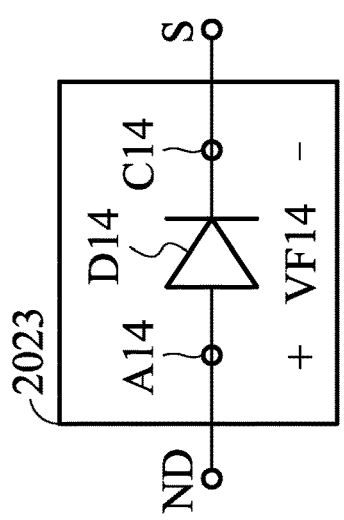
FIG. 22 is a block diagram of a second voltage control circuit in accordance with another embodiment of the invention.

FIG. 22 is a block diagram of a second voltage control circuit in accordance with another embodiment of the invention. As shown in FIG. 22, the second voltage control circuit 2023 includes a fourteenth diode D14. The fourteenth diode D14 includes a fourteenth anode A14 coupled to the driving node ND and a fourteenth cathode C14 coupled to the source terminal S of the switch device 2010.

According to an embodiment of the invention, when the voltage across the gate terminal G to the source terminal S of the switch device 2010 exceeds the fourteenth forward voltage VF14 of the fourteenth diode D14, the fourteenth diode D14 is turned on so that the voltage across the gate terminal G to the source terminal S of the switch device 2010 is clamped at the fourteenth forward voltage VF14.

Figure 23:
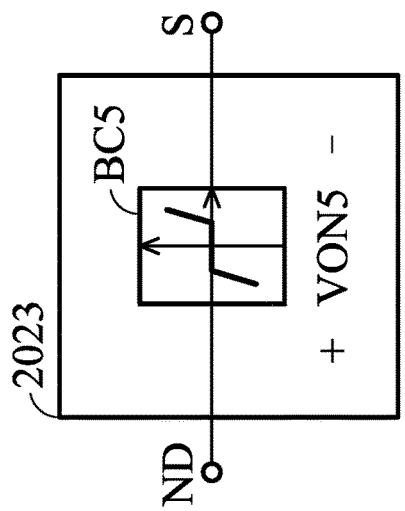
FIG. 23 is a block diagram of a second voltage control circuit in accordance with another embodiment of the invention.

FIG. 23 is a block diagram of a second voltage control circuit in accordance with another embodiment of the invention. As shown in FIG. 23, the second voltage control circuit 2023 includes a fifth bidirectional-conducting device BC5.

The fifth bidirectional-conducting device BC5 is coupled between the driving node ND and the source terminal S of the switch device 2010.

According to an embodiment of the invention, when the voltage across the gate terminal G to the source terminal S of the switch device 2010 exceeds the fifth turn-on voltage VON5 of the fifth bidirectional-conducting; device BC5, the fifth bidirectional-conducting device BC5 is turned on so that the voltage across the gate terminal G to the source terminal S of the switch device 2010 is clamped at the fifth turn-on voltage VON5.

Figure 24:
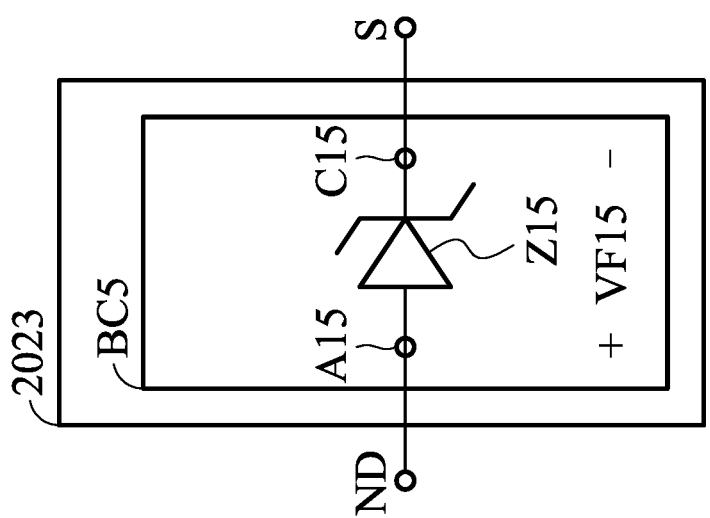
FIG. 24 is a block diagram bidirectional-conducting device circuit in accordance with an embodiment of the invention.

FIG. 24 is a block diagram of a fifth bidirectional-conducting device circuit in accordance with an embodiment of the invention. As shown in FIG. 24, the fifth bidirectional-conducting device BC5 includes a fifteenth zener Z15. The fifteenth zener Z15 includes a fifteenth anode A15 coupled to the driving node ND and a second cathode C15 coupled to the source terminal S of the switch device 2010.

According to an embodiment of the invention, when the voltage across the gate terminal G to the source terminal S of the switch device 2010 exceeds a fifteenth forward voltage VF15 of the fifteenth zener Z15, the fifteenth zener Z15 is forward-biased so that the voltage across the gate terminal G to the source terminal S of the switch device 2010 is clamped at the fifteenth forward voltage VF15.

Figure 25:
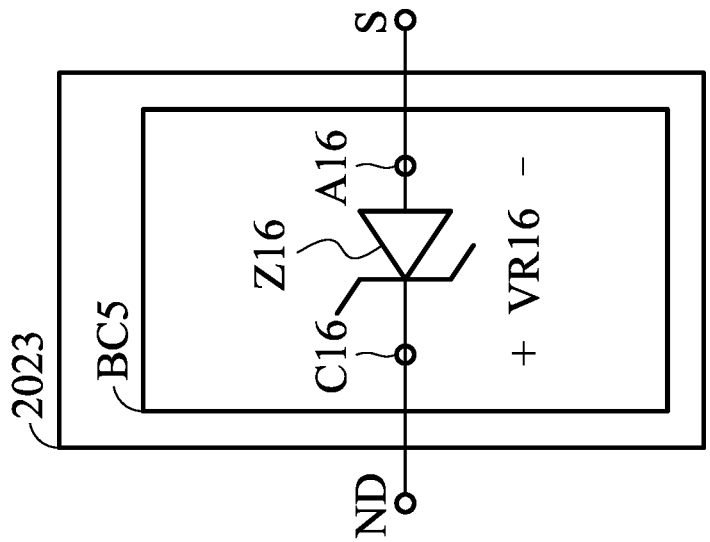
FIG. 25 is a block diagram of a fifth bidirectional-conducting device circuit in accordance with another embodiment of the invention.

FIG. 25 is a block diagram of a fifth bidirectional-conducting device circuit in accordance with another embodiment of the invention. As shown in FIG. 25, the fifth bidirectional-conducting device BC5 includes a sixteenth zener Z16. The sixteenth zener Z16 includes a sixteenth anode A16 coupled to the source terminal S of the switch device 2010 and a sixteenth cathode C16 coupled to the driving node ND.

According to an embodiment of the invention, when the voltage across the gate terminal G to the source terminal S of the switch device 2010 exceeds a sixteenth reverse voltage VR16 of the sixteenth zener Z16, the sixteenth zener Z16 is reverse-biased so that the voltage across the gate terminal G to the source terminal S of the switch device 2010 is clamped at the sixteenth reverse voltage VR16.

Figure 26:
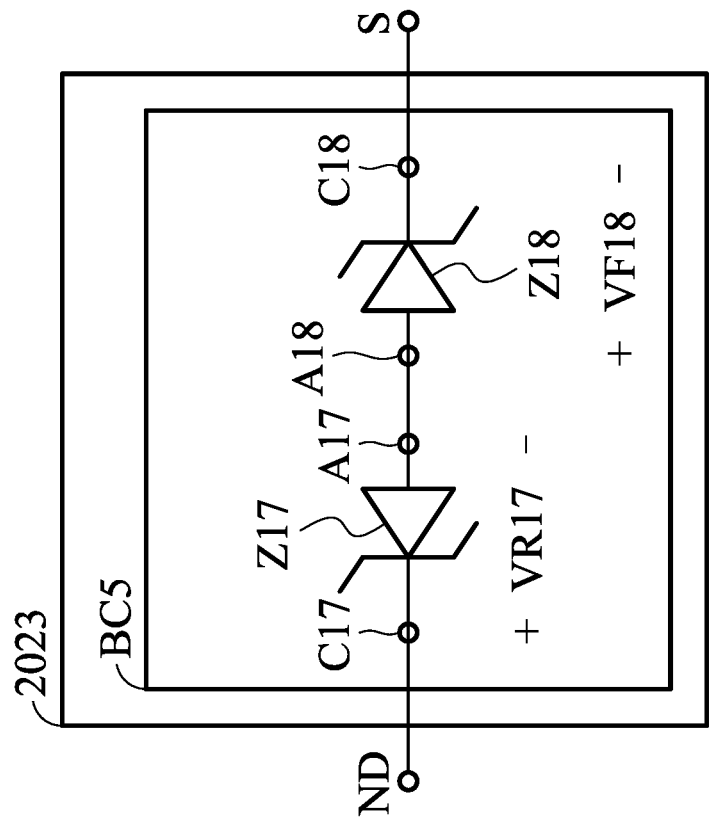
FIG. 26 is a block diagram of a fifth bidirectional-conducting device circuit in accordance with another embodiment of the invention.

FIG. 26 is a block diagram of a fifth bidirectional-conducting device circuit in accordance with another embodiment of the invention. As shown in FIG. 26, the fifth bidirectional-conducting device BC5 includes a seventeenth zener Z17 and an eighteenth zener Z18. The seventeenth zener Z17 includes a seventeenth anode A17 and a seventeenth cathode C17 coupled to the driving node ND. The eighteenth zener Z18 includes an eighteenth anode A18 coupled to the seventeenth anode A17 and an eighteenth cathode C18 coupled to the source terminal S of the switch device 2010.

According to an embodiment of the invention, when the voltage across the gate terminal G to the source terminal S of the switch device 2010 exceeds a sum of a seventeenth reverse voltage VR17 of the seventeenth zener Z17 and an eighteenth forward voltage VF18 of the eighteenth zener Z18, the voltage across the gate terminal G to the source terminal S of the switch device 2010 is clamped at the sum of the seventeenth reverse voltage VR17 of the seventeenth zener Z17 and the eighteenth forward voltage VF18 of the eighteenth zener Z18.

Figure 27:
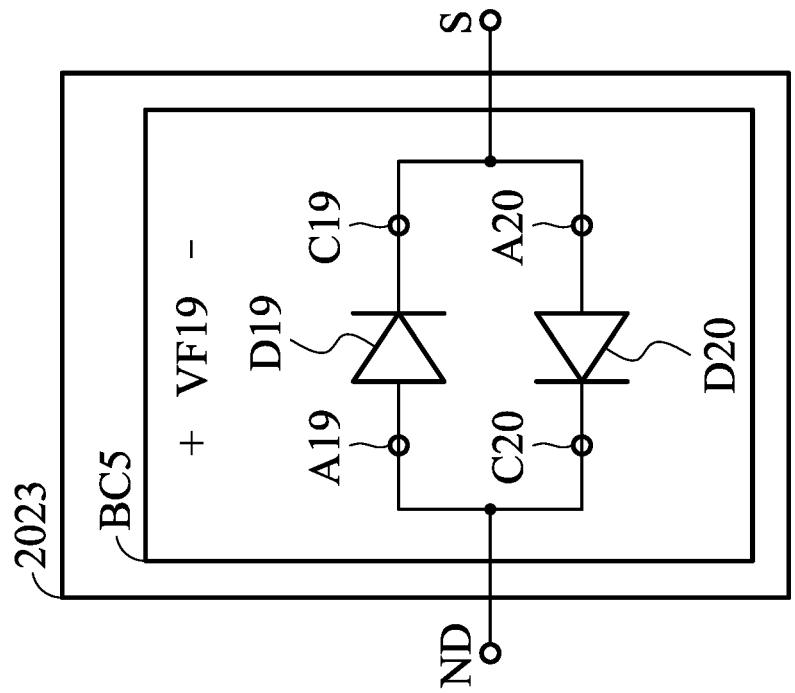
FIG. 27 is a block diagram of a fifth bidirectional-conducting device circuit in accordance with another embodiment of the invention.

FIG. 27 is a block diagram of a fifth bidirectional-conducting device circuit in accordance with another embodiment of the invention. As shown in FIG. 27, the fifth bidirectional-conducting device BC5 includes a nineteenth diode D19 and a twentieth diode D20. The nineteenth diode D19 includes a nineteenth anode A19 coupled to the driving node ND and a nineteenth cathode C19 coupled to the source terminal S of the switch device 2010. The twentieth diode D20 includes a twentieth anode A20 coupled to the source terminal S of the switch device 2010 and a twentieth cathode C20 coupled to the driving node ND.

According to an embodiment of the invention, when the voltage across the gate terminal G to the source terminal S of the switch device 2010 exceeds a nineteenth forward voltage VF19 of the nineteenth diode D19, the voltage across the gate terminal G to the source terminal S of the switch device 2010 is clamped at the nineteenth forward voltage VF19 of the nineteenth diode D19.

Figure 28:
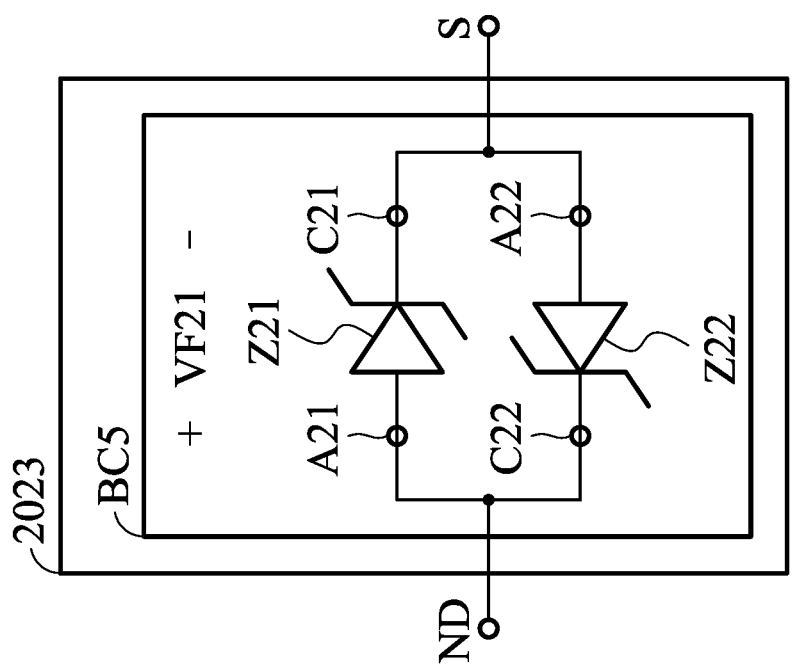
FIG. 28 is a block diagram of a fifth bidirectional-conducting device circuit in accordance with another embodiment of the invention.

FIG. 28 is a block diagram of a fifth bidirectional-conducting device circuit in accordance with another embodiment of the invention. As shown in FIG. 28, the fifth bidirectional-conducting device BC5 includes a twenty-first zener Z21 and a twenty-second zener Z22. The twenty-first zener Z21 includes a twenty-first anode A21 coupled to the driving node NC and a twenty-first cathode C21 coupled to the source terminal S of the switch device 2010. The twenty-second zener Z22 includes a twenty-second anode A22 coupled to the source terminal S of the switch device 2010 and a twenty-second cathode C22 coupled to the driving node ND.

According to an embodiment of the invention, when the voltage across the gate terminal G to the source terminal S of the switch device 2010 exceeds a twenty-first forward voltage VF21 of the twenty-first zener Z21, the voltage across the gate terminal G to the source terminal S of the switch device 2010 is clamped at the twenty-first forward voltage VF21 of the twenty-first zener Z21.

Figure 29:
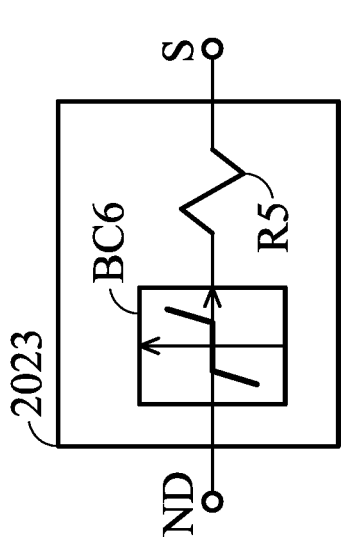
FIG. 29 is a block diagram of a second voltage control circuit in accordance with another embodiment of the invention.

FIG. 29 is a block diagram of a second voltage control circuit in accordance with another embodiment of the invention. As shown in FIG. 29, the second voltage control circuit 2023 includes a fifth resistor R5 and a sixth bidirectional-conducting device BC6. The fifth resistor R5 is coupled to the source terminal S of the switch device 2010. The sixth bidirectional-conducting device BC6 is coupled between the driving node ND and the fifth resistor R5. According to some embodiments of the invention, the sixth bidirectional-conducting device BC6 may be implemented by the fifth bidirectional-conducting device BC5 as shown in FIGS. 21-28.

Figure 30:
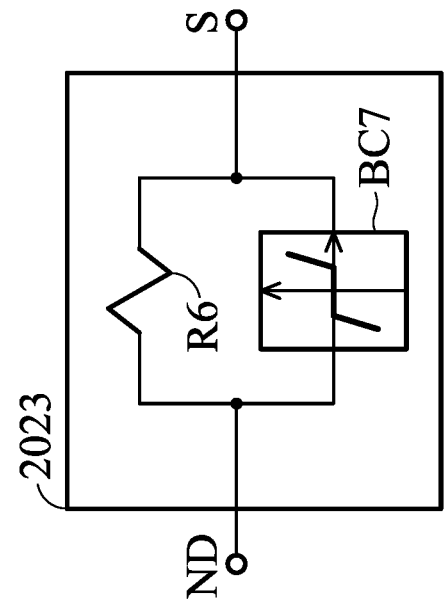
FIG. 30 is a block diagram of a second voltage control circuit in accordance with another embodiment of the invention.

FIG. 30 is a block diagram of a second voltage control circuit in accordance with another embodiment of the invention. As shown in FIG. 30, the second voltage control circuit 2023 includes a sixth resistor R6 and a seventh bidirectional-conducting device BC7. The sixth resistor R6 is coupled between the driving node ND and the source terminal S of the switch device 2010. The seventh bidirectional-conducting device BC7 is coupled between the driving node ND and the source terminal S of the switch device 2010. According to some embodiments of the invention, the seventh bidirectional-conducting device BC7 may be implemented by the fifth bidirectional-conducting device BC5 as shown in FIGS. 21-28.

Figure 31:
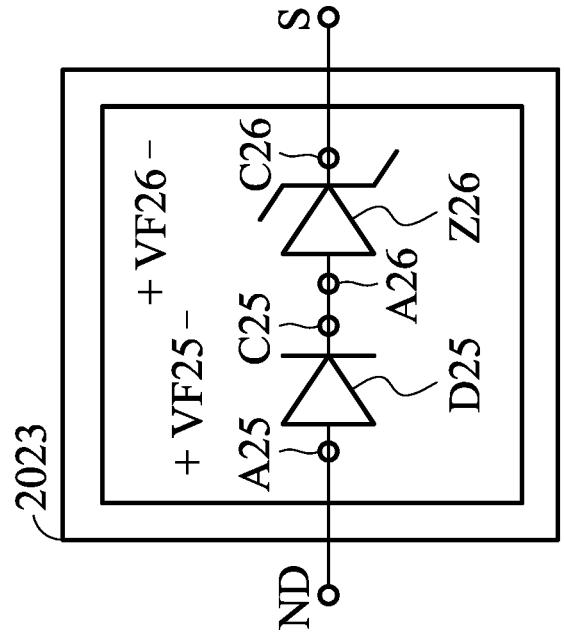
FIG. 31 is a block diagram of a second voltage control circuit in accordance with another embodiment of the invention.

FIG. 31 is a block diagram of a second voltage control circuit in accordance with another embodiment of the invention. As shown in FIG. 31, the second voltage control circuit 2023 includes a seventh bidirectional-conducting device BC7, a seventh resistor R7, and an eighth bidirectional-conducting device BC8. The seventh bidirectional-conducting device BC7 is coupled to the driving node ND. The seventh resistor R7 is coupled between the seventh bidirectional-conducting device BC7 and the source terminal S of the switch device 2010. The eighth bidirectional-conducting device BC8 is coupled between the seventh bidirectional-conducting device BC7 and the source terminal S of the switch device 2010. According to some embodiments of the invention, any one of the seventh bidirectional-conducting device BC7 and the eighth bidirectional-conducting device BC5 may be implemented by the fifth bidirectional-conducting device BC5 as shown in FIGS. 21-28.

Figure 32:
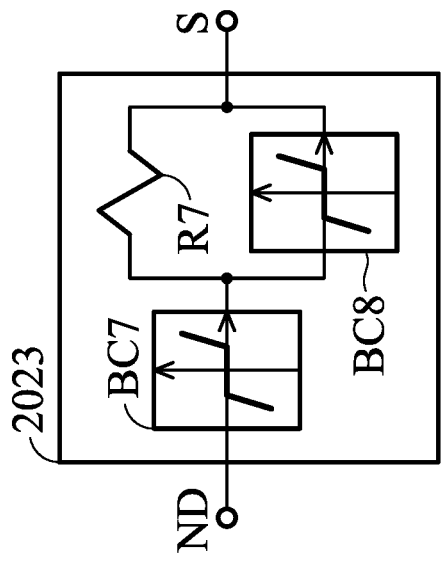
FIG. 32 is a block diagram of a second voltage control circuit in accordance with another embodiment of the invention.

FIG. 32 is a block diagram of a second voltage control circuit in accordance with another embodiment of the invention. As shown in FIG. 32, the second voltage control circuit 2023 includes a twenty-third diode D23 and a twenty-fourth zener Z24. The twenty-third diode D23 includes a twenty-third anode A23 coupled to the driving node ND and a twenty-third cathode C23. The twenty-fourth zener Z24 includes a twenty-fourth anode A24 coupled to the source terminal S of the switch device 2010 and a twenty-fourth cathode C24 coupled to the twenty-third cathode C23.

According to an embodiment of the invention, when the voltage across the gate terminal G to the source terminal S of the swatch device 2010 exceeds a sum of a twenty-third forward voltage VF23 of the twenty-third diode D23 and a twenty-fourth reverse voltage VR24 of the eighteenth zener Z24, the voltage across the gate terminal G to the source terminal S of the switch device 2010 is clamped at the sum of the twenty-third forward voltage VF23 of the twenty-third diode D23 and the twenty-fourth reverse voltage VR24 of the twenty-fourth zener Z24.

Figure 33:
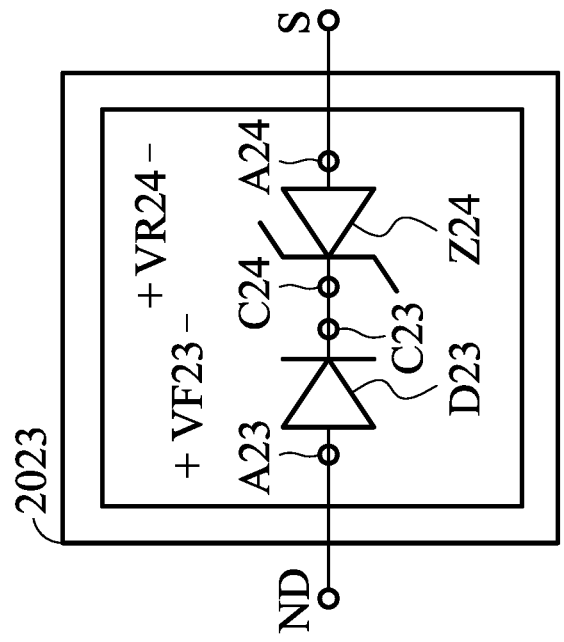
FIG. 33 is a block diagram of a second voltage control circuit in accordance with another embodiment of the invention.

FIG. 33 is a block diagram of a second voltage control circuit in accordance with another embodiment of the invention. As shown in FIG. 33, the voltage control circuit 2023 includes a twenty-fifth diode D25 and a twenty-sixth zener 726. The twenty-fifth diode D25 includes a twenty-fifth anode A25 coupled to the driving node ND and a twenty-fifth cathode C25. The twenty-sixth zener 726 includes a twenty-sixth anode A26 coupled to the twenty-fifth cathode C25 and a twenty-sixth cathode C26 coupled to the source terminal S of the switch device 2010.

According to an embodiment of the invention, when the voltage across the gate terminal G to the source terminal S of the switch device 2010 exceeds a sum of a twenty-fifth forward voltage V of the twenty-fifth diode D25 and a twenty-sixth forward voltage VR26 of the twenty-sixth zener Z26, the voltage across the gate terminal G to the source terminal S of the switch device 2010 is clamped at the sum of the twenty-fifth forward voltage VF25 of the twenty-fifth diode D25 and the twenty-sixth forward voltage VF26 of the twenty-sixth zener 726.

Self-driven gate-driving circuits are provided herein. The proposed self-driven gate-driving circuits do not require a supply voltage for powering nor a plurality of transistors, which leads to greatly power consumption reduction and cost reduction.

Although some embodiments of the present disclosure and their advantages have been described in detail, it should be understood that various changes, substitutions and alterations can be made herein hoot departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A gate-driving circuit for turning on and off a switch device comprising a gate terminal coupled to a driving node, a drain terminal coupled to a power node, and a source terminal, the gate-driving circuit comprising:
    a driving switch, comprising a gate terminal coupled to a control node, a drain terminal coupled to the power node, and a source terminal coupled to the driving node;
    a voltage control circuit, coupled between the control node and the driving node, wherein when a positive pulse is generated at the control node, the voltage control circuit provides the positive pulse to the driving node with a time delay; and
    a second voltage control circuit, coupled between the driving node and the source terminal of the switch device and configured to clamp a voltage from the gate terminal to the source terminal of the switch device.

2. The gate-driving circuit as defined in claim 1, wherein when the positive pulse is generated at the control node, a voltage of the control node rises from a low voltage level to a supply voltage so that the driving switch is turned on to provide a power voltage of the power node to the driving node so as to turn on the switch device.

3. The gate-driving circuit as defined in claim 1, wherein when the voltage of the control node reaches the supply voltage, a driving voltage of the driving node is still in a low voltage level so that the driving switch is turned on due to a voltage difference from the control node to the driving node so as to turn on the switch device.

4. The gate-driving circuit as defined in claim 1, wherein the switch device is a silicon device or a SiC device or a GaN device.

5. The gate-driving circuit as defined in claim 1, wherein the driving switch is a silicon device or a SiC device or a GaN device.

6. The gate-driving circuit as defined in claim 1, wherein the voltage control circuit comprises:
    a first resistor, coupled between the control node and the driving node.

7. The gate-driving circuit as defined in claim 1, wherein the voltage control circuit comprises:
    a transistor, comprising a control terminal coupled to the control node, a first terminal coupled to the control node, and a second terminal coupled to the driving node.

8. The gate-driving circuit as defined in claim 1, wherein the voltage control circuit comprises:
    a first diode, comprising an anode coupled to the control node and a cathode coupled to the driving node.

9. The gate-driving circuit as defined in claim 1, wherein the voltage control circuit comprises:
    a zener, comprising an anode coupled to the control node and a cathode coupled to the driving node.

10. The gate-driving circuit as defined in claim 1, wherein the voltage control circuit comprises:
    a zener, comprising an anode coupled to the driving node and a cathode coupled to the control node.

11. The gate-driving circuit as defined in claim 1, wherein the voltage control circuit comprises:
    a first zener, comprising an anode and a cathode coupled to the control node; and
    a second zener, comprising an anode coupled to the anode of the first zener and a cathode coupled to the driving node.

12. The gate-driving circuit as defined in claim 1, wherein the voltage control circuit comprises:
    a first diode, comprising an anode coupled to the control node and a cathode coupled to the driving node; and
    a second diode, comprising an anode coupled to the driving node and a cathode coupled to the control node.

13. The gate-driving circuit as defined in claim 1, wherein the voltage control circuit comprises:
    a first zener, comprising an anode coupled to the control node and a cathode coupled to the driving node; and
    a second zener, comprising an anode coupled to the driving node and a cathode coupled to the control node.

14. The gate-driving circuit as defined in claim 1, wherein the voltage control circuit comprises:
    a current-control resistor, coupled to the control node;
    a first transistor, comprising a control terminal coupled to the current-control resistor, a first terminal coupled to the current-control resistor, and a second terminal;
    a second transistor, comprising a control terminal coupled to the second terminal of the first transistor, a first terminal coupled to the second terminal of the first transistor, and a second terminal;
    a third transistor, comprising a control terminal coupled to the second terminal of the second transistor, a first terminal coupled to the second terminal of the second transistor, and a second terminal coupled to the driving node; and
    a reverse diode, comprising a reverse anode coupled to the driving node and a reverse cathode coupled to the control node.

15. The gate-driving circuit as defined in claim 1, wherein the voltage control circuit comprises:
    a first diode, comprising an anode coupled to the control node and a cathode; and
    a second zener, comprising an anode coupled to the driving node and a cathode coupled to the cathode of the first diode.

16. The gate-driving circuit as defined in claim 1, wherein the voltage control circuit comprises:
    a first diode, comprising an anode coupled to the control node and a cathode; and
    a second zener, comprising an anode coupled to the cathode of the first diode and a cathode coupled to the driving node.

17. The gate-driving circuit as defined in claim 1, wherein the voltage control circuit comprises:
    a first resistor, coupled to the driving node; and
    a first bidirectional-conducting device, coupled between the first resistor and the control node.

18. The gate-driving circuit as defined in claim 1, wherein the voltage control circuit comprises:
    a first resistor, coupled between the control node and the driving node; and
    a first bidirectional-conducting device, coupled between the control node and the driving node.

19. The gate-driving circuit as defined in claim 1, wherein the voltage control circuit comprises:
    a first bidirectional-conducting device, coupled to the control node;
    a first resistor, coupled between the first bidirectional-conducting device and the driving node; and a second bidirectional-conducting device, coupled between the first bidirectional-conducting device and the driving node.

20. The gate-driving circuit as defined in claim 1, wherein the second voltage control circuit comprises:
   a first transistor, comprising a control terminal coupled to the driving node, a first terminal coupled to the driving node, and a second terminal coupled to the source terminal of the switch device.

21. The gate-driving circuit as defined in claim 1, wherein the second voltage control circuit comprises:
   a first diode, comprising a first anode coupled to the driving node and a first cathode coupled to the source terminal of the switch device, wherein the voltage across the gate terminal to the source terminal of the switch device is clamped at a first forward voltage of the first diode.

22. The gate-driving circuit as defined in claim 1, wherein the second voltage control circuit comprises:
   a first zener, comprising a first anode coupled to the driving node and a first cathode coupled to the source terminal of the switch device, wherein the voltage across the gate terminal to the source terminal of the switch device is clamped at a first forward voltage of the first zener.

* * * * *